(12) United States Patent
Sim et al.

(10) Patent No.: US 10,403,608 B2
(45) Date of Patent: Sep. 3, 2019

(54) LIGHT-EMITTING DIODE (LED) DEVICE FOR REALIZING MULTI-COLORS

(71) Applicant: SAMSUNG ELECTRONICS CO., LTD., Suwon-si, Gyeonggi-do (KR)

(72) Inventors: Sung-hyun Sim, Uiwang-si (KR); Yong-il Kim, Seoul (KR); Wan-tae Lim, Suwon-si (KR); Ji-hye Yeon, Suwon-si (KR); Ha-nul Yoo, Bucheon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/833,495

(22) Filed: Dec. 6, 2017

(65) Prior Publication Data

US 2018/0166424 A1   Jun. 14, 2018

(30) Foreign Application Priority Data

Dec. 14, 2016   (KR) .......................... 10-2016-0170417

(51) Int. Cl.
*H01L 33/00*   (2010.01)
*H01L 33/22*   (2010.01)
(Continued)

(52) U.S. Cl.
CPC .......... *H01L 25/0753* (2013.01); *H01L 33/44* (2013.01); *H01L 33/483* (2013.01); *H01L 33/54* (2013.01); *H01L 33/62* (2013.01); *H01L 33/0079* (2013.01); *H01L 33/22* (2013.01); *H01L 33/504* (2013.01); *H01L 33/505* (2013.01); *H01L 33/60* (2013.01); *H01L 2933/005* (2013.01);
(Continued)

(58) Field of Classification Search
CPC combination set(s) only.
See application file for complete search history.

(56) References Cited

U.S. PATENT DOCUMENTS 6,372,608 B1   4/2002   Shimoda et al.
6,645,830 B2   11/2003   Shimoda et al.
(Continued)

FOREIGN PATENT DOCUMENTS

KR   10-2006-0087171 A   8/2006
KR   10-2015-0021235 A   3/2015

*Primary Examiner* — Telly D Green
(74) *Attorney, Agent, or Firm* — Lee & Morse, P.C.

(57) ABSTRACT

A light-emitting diode (LED) device includes a plurality of light-emitting structures spaced apart from each other; a plurality of electrode layers on first surfaces of the plurality of light-emitting structures, respectively; a protection layer on second surfaces of each of the plurality of light-emitting structures, respectively; a separation layer to electrically insulate the plurality of light-emitting structures from each other and electrically insulate the plurality of electrode layers from each other; a plurality of phosphor layers on second surfaces of the plurality of light-emitting structures, respectively, each of the plurality of the phosphor layers each to output a different color of light; and a partitioning layer between the phosphor layers and separating the plurality of phosphor layers from each other, the partitioning layer including a substrate structure, an insulation structure, or a metal structure.

20 Claims, 22 Drawing Sheets

(51) Int. Cl.
   *H01L 33/44*   (2010.01)
   *H01L 33/48*   (2010.01)
   *H01L 33/50*   (2010.01)
   *H01L 33/54*   (2010.01)
   *H01L 33/60*   (2010.01)
   *H01L 33/62*   (2010.01)
   *H01L 25/075*  (2006.01)

(52) U.S. Cl.
   CPC ......... *H01L 2933/0025* (2013.01); *H01L 2933/0033* (2013.01); *H01L 2933/0041* (2013.01); *H01L 2933/0058* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,244,957 B2 | 7/2007 | Nakajo et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,304,795 B2 | 11/2012 | Yamaguchi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 8,916,901 B2 * | 12/2014 | Kimura | H01L 25/167 257/98 |
| 9,112,121 B2 * | 8/2015 | Jung | H01L 33/50 |
| 9,196,653 B2 | 11/2015 | Leatherdale et al. | |
| 9,236,524 B2 | 1/2016 | Jeon et al. | |
| 9,312,435 B2 | 4/2016 | Gärtner et al. | |
| 9,419,242 B2 * | 8/2016 | Baek | H01L 51/525 |
| 9,887,332 B2 * | 2/2018 | Choi | H01L 33/62 |
| 9,905,543 B2 * | 2/2018 | Yeon | H01L 25/0753 |
| 2008/0048202 A1 | 2/2008 | Tazima et al. | |
| 2011/0234118 A1 * | 9/2011 | Kim | C09K 11/0883 315/291 |
| 2013/0082294 A1 * | 4/2013 | Nakayama | H01L 33/56 257/98 |
| 2013/0248910 A1 * | 9/2013 | Kimura | H01L 25/167 257/98 |
| 2014/0353630 A1 * | 12/2014 | Baek | H01L 51/525 257/40 |
| 2016/0160122 A1 * | 6/2016 | You | C09K 11/617 428/403 |
| 2016/0190105 A1 | 6/2016 | Rhee et al. | |
| 2016/0293805 A1 | 10/2016 | Choi | |
| 2016/0351767 A1 * | 12/2016 | Choi | H01L 33/62 |
| 2017/0250316 A1 * | 8/2017 | Yeon | H01L 25/0753 |
| 2018/0166425 A1 * | 6/2018 | Yeon | H01L 25/0753 |

\* cited by examiner

LIGHT-EMITTING DIODE (LED) DEVICE FOR REALIZING MULTI-COLORS

CROSS-REFERENCE TO RELATED APPLICATION

Korean Patent Application No. 10-2016-0170417, filed on Dec. 14, 2016, in the Korean Intellectual Property Office, and entitled: "Light-Emitting Diode (LED) Device for Realizing Multi-Colors," is incorporated by reference herein in its entirety.

BACKGROUND

1. Field

Embodiments relate to a light-emitting diode (LED) device, and more particularly, to an LED device for realizing multi-colors.

2. Description of the Related Art

When a plurality of light-emitting diode (LED) devices are mounted on a substrate, a plurality of colors, e.g., multi-colors, may be realized. When a display device includes pixels comprising LED devices mounted on a substrate, there is a limit in reducing a size of the display device to improve a resolution thereof, and it is also difficult to suppress optical interference between pixels.

SUMMARY

According to an aspect, there is provided a light-emitting diode (LED) device including: a plurality of light-emitting structures spaced apart from each other; a plurality of electrode layers on first surfaces of the plurality of light-emitting structures, respectively; a protection layer on a second surface of each of the plurality of light-emitting structures; a separation layer configured to electrically insulate the plurality of light-emitting structures from each other and electrically insulate the plurality of electrode layers from each other; a plurality of phosphor layers on the second surfaces of the plurality of light-emitting structures, respectively, the phosphor layers each to output a different color of light from the other phosphor layers; and a partitioning layer between the phosphor layers and separating the phosphor layers from each other, the partitioning layer comprising a substrate structure, an insulation structure, or a metal structure.

According to another aspect, there is provided a light-emitting diode (LED) device including: a plurality of light-emitting structures spaced apart from one another; a plurality of electrode layers on first surfaces of the plurality of light-emitting structures, respectively; a separation layer and a partitioning layer included in a common layer that fills a separation hole extending from the first surfaces of the plurality of light-emitting structures down to second surfaces of the plurality of light-emitting structures, the separation hole to separate light-emitting structures from each other; a protection layer on the second surfaces of the plurality of light-emitting structures; and a plurality of phosphor layers respectively on the second surfaces of the plurality of light-emitting structures separated from one another by the partitioning layers, the plurality of phosphor layers associated with different colors, wherein the partition layer includes at least one of a substrate structure, an insulation structure, and a metal structure, and a sidewall of the partitioning layer is sloped such that a diameter of a space surrounded by the sidewall increases in a direction in which light travels.

According to another aspect, there is provided a light-emitting diode (LED) device including: a plurality of light-emitting structures spaced apart from each other; a plurality of electrode layers on first surfaces of the plurality of light-emitting structures, respectively; a separation layer that fills a separation hole extending from the first surfaces of the plurality of light-emitting structures to second surfaces of the plurality of light-emitting structures, the separation hole to separate light-emitting structures from each other; a protection layer on a second surface of each of the plurality of light-emitting structures; a partitioning layer on the separation layer; a reflection layer on a sidewall of the partitioning layer; and a plurality of phosphor layers respectively on the second surfaces of the plurality of light-emitting structures and separated from one another by the partitioning layers, the plurality of phosphor layers associated with different colors, wherein the partitioning layer includes at least one of a substrate structure, an insulation structure, and a metal structure.

According to another aspect, there is provided a light-emitting diode (LED) including a plurality of light-emitting structures spaced apart from each other, a plurality of electrode layers on first surfaces of the plurality of light-emitting structures, respectively, a protection layer on second surfaces of the plurality of light-emitting structures, respectively, and a separation layer that fills a separation hole extending from the first surfaces of the plurality of light-emitting structures to second surfaces of the plurality of light-emitting structures, respectively, the separation hole to separate light-emitting structures from each other, wherein a diameter of the separation hole decreases from the first surfaces to the second surfaces of the plurality of light-emitting structures, respectively.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
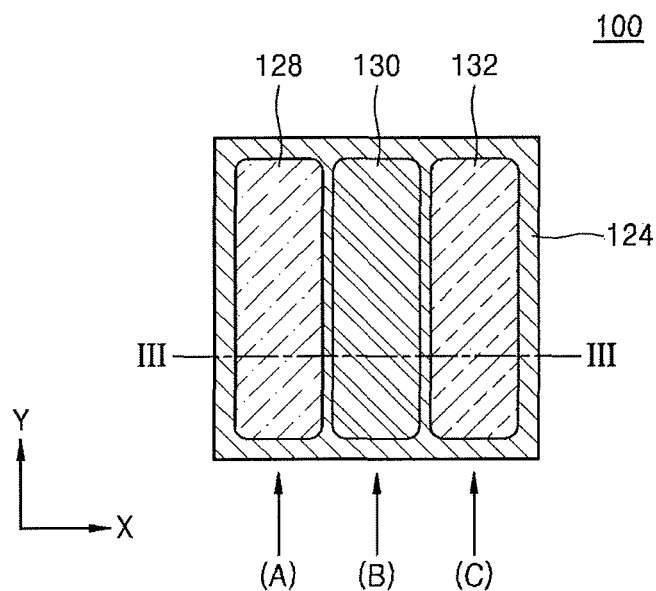
FIGS. 1 and 2 illustrate plan views of a light-emitting diode (LED) device according to an embodiment.
Figure 2:
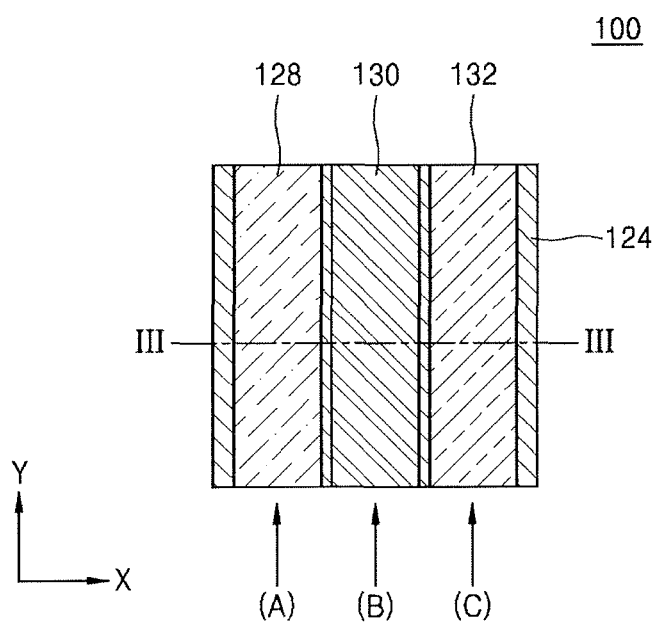

FIGS. 1 and 2 are plan views of a light-emitting diode (LED) device 100 according to an embodiment. In detail, the LED device 100 may include a plurality of light-emitting cells A, B, and C, e.g., a first light-emitting cell A, a second light-emitting cell B, and a third light-emitting cell C. Although the LED device 100 includes the three light-emitting cells A, B, and C for convenience of explanation, the LED device 100 may also include only two light-emitting cells, or may include more than three light-emitting cells.

The light-emitting cells A, B, and C may be defined by a partitioning layer 124 extending in the x-axis direction and/or the y-axis direction. The partitioning layer 124 of FIG. 1 may surround phosphor layers 128, 130, and 132. In FIG. 2, the light-emitting cells A, B, and C may be defined by a partitioning layer 124 extending in the y-axis direction. The partitioning layer 124 may be arranged at both sides of the phosphor layers 128, 130, and 132. As will be described later, the partitioning layer 124 may include a substrate structure, an insulation structure, or a reflection structure. The partitioning layer 124 may include a single body.

Figure 3:
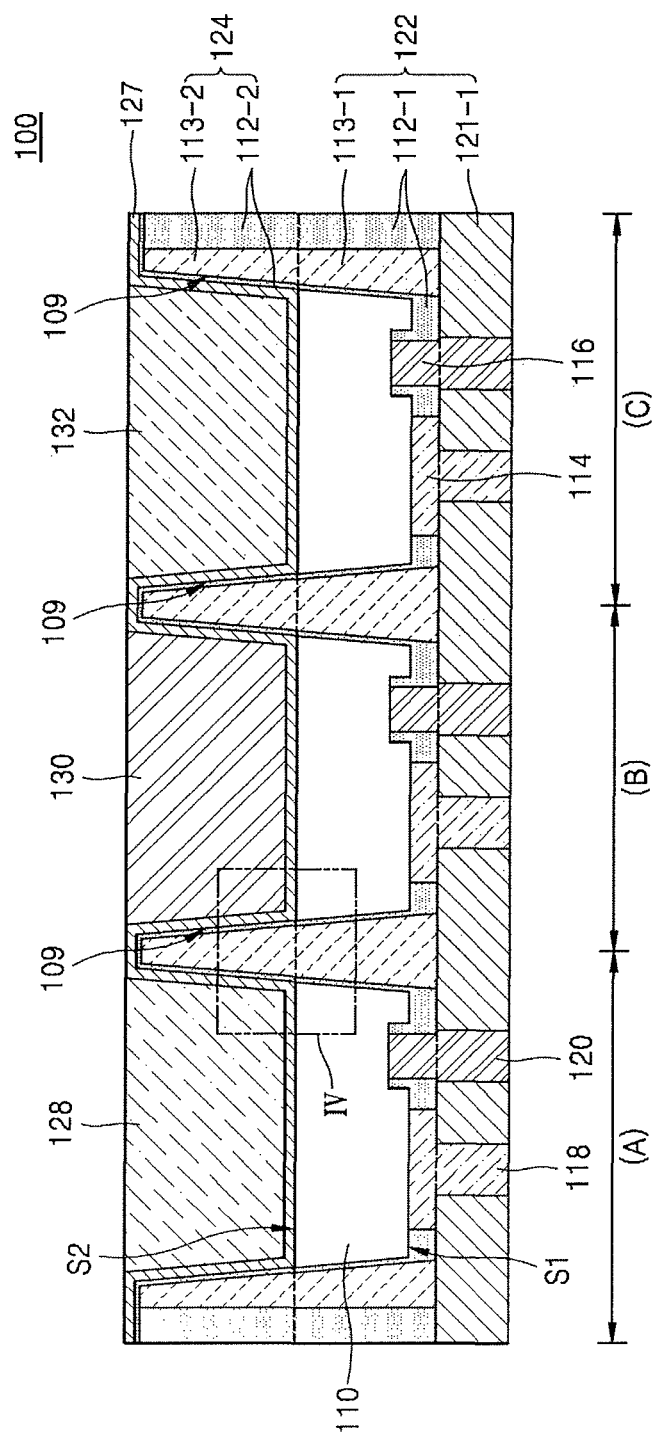
FIG. 3 illustrates a cross-sectional view of portions of the LED device, taken along a line III-III of FIGS. 1 and 2.
Figure 4:
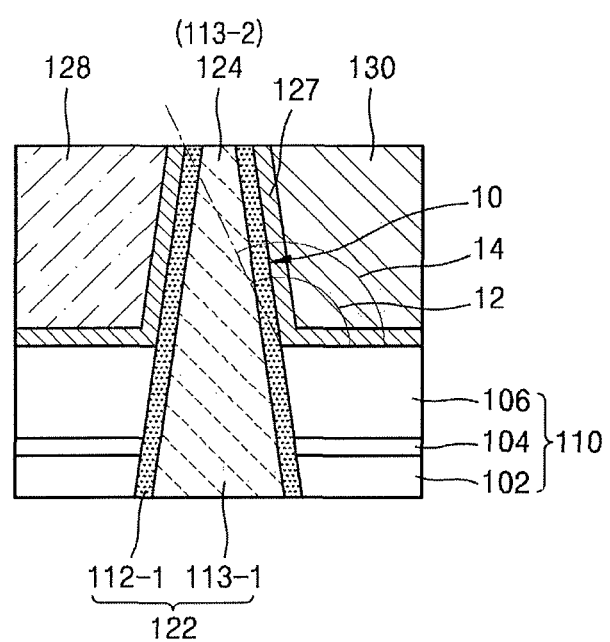
FIG. 4 illustrates an enlarged view of portion IV of FIG. 3.

FIG. 3 is a cross-sectional view of portions of the LED device, obtained along a line III-III of FIGS. 1 and 2, and FIG. 4 is an enlarged view of portion IV of FIG. 3. In detail, the LED device 100 may include the light-emitting structure 110 for each of the respective light-emitting cells A, B, and C. The light-emitting structures 110 may be spaced apart from one another in a first direction, e.g., the x-axis direction of FIGS. 1 and 2. Each of the light-emitting cells A, B, and C may include the light-emitting structure 110 that emits light of an ultraviolet wavelength or light of a blue wavelength.

As shown in FIG. 4, the light-emitting structure 110 may include a first conductive type semiconductor layer 102, an active layer 104, and a second conductive type semiconductor layer 106. The first conductive type semiconductor layer 102 may be a P-type semiconductor layer. The second conductive type semiconductor layer 106 may be an N-type semiconductor layer. The first conductive type semiconductor layer 102 and the second conductive type semiconductor layer 106 may include a nitride semiconductor, e.g., a GaN/InGaN material, e.g., a material having the composition of $Al_xIn_yGa_{1-x-y}N$ ($0 \leq x \leq 1$, $0 \leq y \leq 1$, $0 \leq x+y \leq 1$).

Each of the first conductive type semiconductor layer 102 and the second conductive type semiconductor layer 106 may be embodied as a single layer or may include a plurality of layers having different properties including doping concentration and composition. Other than nitride semiconductors, the first conductive type semiconductor layer 102 and the second conductive type semiconductor layer 106 may also include an AlInGaP-based semiconductor or an AlInGaAs-based semiconductor.

The active layer 104 between the first conductive type semiconductor layer 102 and the second conductive type semiconductor layer 106 may emit light having a certain energy level, according to the recombination of electrons and holes. The active layer 104 may have a multi-quantum well (MQW) structure in which quantum well layers and quantum barrier layers are alternately stacked, e.g., a GaN/InGaN structure when the first conductive type semiconductor layer 102 and the second conductive type semiconductor layer 106 include a nitride semiconductor. The active layer 104 may have a single quantum-well (SQW) structure including a nitride semiconductor. The active layer 104 may emit light of an ultraviolet wavelength or light of a blue wavelength based on types and compositions of materials.

In the LED device 100, electrode layers 118 and 120 may be on a first surface S1 of each of the light-emitting structures 110. As shown in FIG. 3, the electrode layers 118 and 120 may be on the first or bottom surface S1 of each of the light-emitting structure 110. Therefore, the LED device 100 may be mounted on a substrate, e.g., a board substrate, in a flip-chip manner.

The electrode layers 118 and 120 may include a metal. The electrode layers 118 and 120 may include aluminum (Al), gold (Au), silver (Ag), platinum (Pt), nickel (Ni), chromium (Cr), titanium (Ti), or copper (Cu). The electrode layers 118 and 120 may include a first electrode layer 118 electrically connected to the first conductive type semiconductor layer 102 and a second electrode layer 120 electrically connected to the second conductive type semiconductor layer 106.

A first reflective layer 114 and a second reflective layer 116 may be further disposed on the first electrode layer 118 and the second electrode layer 120, respectively. The first reflective layer 114 and the second reflective layer 116 may be on the first surface S1 of the light-emitting structure 110, e.g., may be between the light emitting structure and the first electrode layer 118 and the second electrode layer 120, respectively. The first reflective layer 114 may extend further in the first or X direction than the first electrode layer 118. The second reflective layer 116 may be shorter in the first or X direction than second electrode layer 120. The second reflective layer 116 may extend further in a third or Z direction, orthogonal to the first and second directions, towards the light-emitting structure 110 than the first reflective layer 114. The first reflective layer 114 and the second reflective layer 116 may reflect light emitted by the light-emitting structure 110. The first reflective layer 114 and the second reflective layer 116 may include a highly reflective material, e.g., a metal.

The first reflective layer 114 and the second reflective layer 116 may be on the first electrode layer 118 and the second electrode layer 120, respectively. The first reflective layer 114 and the second reflective layer 116 may include the same materials as the materials used to form the first electrode layer 118 and the second electrode layer 120, respectively. Thus, the first reflective layer 114 and the second reflective layer 116 may be referred to as electrode layers.

The LED device 100 may further include a separation layer 122 for electrically insulating the light-emitting structures 110 from each other, electrically insulating the reflective layers 114 and 116 from each other, and electrically insulating the electrode layers 118 and 120 from each other. The separation layer 122 may include a first separating insulation layer 112-1 on two opposite sidewalls and the first or bottom surface S1 of the light-emitting structure 110, a first metal layer 113-1 that is insulated from the light-emitting structure 110 by the first separating insulation layer 112-1, and a mold insulation layer 121-1 that insulates the electrode layers 118 and 120 from each other. The first separating insulation layer 112-1 on the first or bottom surface S1 of the light-emitting structure 110 may extend between the first reflective layer 114 and the second reflective layer 116 and may extend along sidewalls of the second reflective layer 116 that protrudes along the third or Z direction above the first reflective layer 114.

The first separating insulation layer 112-1 may include a silicon oxide layer or a silicon nitride layer. The mold insulation layer 121-1 may include a silicon resin, an epoxy resin, or an acrylic resin. A rear surface of the mold insulation layer 121-1 and rear surfaces of the electrode layers 118 and 120 may together form a continuous surface.

The first metal layer 113-1 may include Al, Au, Ag, Pt, Ni, Cr, Ti, or Cu. The first metal layer 113-1 may reflect light emitted by the light-emitting structures 110.

Due to the separation layer 122, the light-emitting structures 110 may be electrically separated from one another and individually driven. The separation layer 122 may separate the light-emitting structures 110 into individual light-emitting cells, e.g., the first light-emitting cell A, the second light-emitting cell B, and the third light-emitting cell C, where each of the light-emitting cells A, B, and C may be individually driven.

In the LED device 100, a protection layer 127 for protecting the light-emitting structures 110 may be provided on second or top surfaces S2 of the light-emitting structures 110. The protection layer 127 protects the second surfaces S2, e.g., light-emitting surfaces, of the light-emitting structures 110, thereby improving light extraction efficiency. The protection layer 127 may include a silicon oxide layer or a silicon nitride layer.

In the LED device 100, a plurality of phosphor layers 128, 130, and 132 having different colors may be on the protection layer 127 of the second surfaces S2 of the light-emitting structures 110, respectively. The phosphor layers 128, 130, and 132 may include a blue phosphor layer 128, a green phosphor layer 130, and a red phosphor layer 132.

Although FIGS. 1-3 show three different phosphor layers 128, 130, and 132, two different phosphor layers may be disposed. The LED device 100 may realize a multi-color display when light emitted by the light-emitting structures 110 pass through the phosphor layers 128, 130, and 132 having different colors.

When the LED device 100 includes the three different phosphor layers 128, 130, and 132, the LED device 100 may implement three colors. When the light-emitting structure 110 emits light of a blue wavelength, the LED device 100 may implement three colors even if the LED device 100 only includes two phosphor layers. Since the LED device 100 may be electrically separated into the respective light-emitting structures 110 and each of the light-emitting structures 110 may be individually driven, various colors may be implemented as needed.

In the LED device 100, the partitioning layer 124 is between the phosphor layers 128, 130, and 132 to separate the phosphor layers 128, 130, and 132 from one another. The partitioning layer 124 may be on the separation layer 122 between the light-emitting structures 110. The partitioning layer 124 may suppress optical interference between the light-emitting cells A, B, and C. The partitioning layer 124 may include a material different from the material used to form the light-emitting structure 110.

The partitioning layer 124 may include a second separating insulation layer 112-2 and a second metal layer 113-2 on side surfaces of each of the phosphor layers 128, 130, and 132. The second separating insulation layer 112-2 and the second metal layer 113-2 may respectively extend from the first separating insulation layer 112-1 and the first metal layer 113-1. The partitioning layer 124 may be arranged at one side of the protection layer 127 formed on side surfaces of each of the phosphor layers 128, 130, and 132, e.g., the protection layer 127 may be between side surfaces of each of the phosphor layers 128, 130, and 132 and the second separating insulation layer 112-2.

The protection layer 127 may be formed on a side surface and a bottom of each of the phosphor layers 128, 130, and 132. The protection layer 127 may be formed on a side surface and an upper surface of the partitioning layer 124. The second separating insulation layer 112-2 may also extend over the second metal layer 113-2 in the X direction to connect to the second separating insulation layer 112-2 of an adjacent light-emitting structure 110, such that second separating insulation layer 112-2 is between, e.g., entirely between, the protection layer 127 and the second metal layer 113-2.

The second metal layer 113-2 may include the same material as a material included in the first metal layer 113-1. The second metal layer 113-2 may reflect light emitted by the light-emitting structures 110 to thereby improve light extraction efficiency of the light-emitting structures 110.

The separation layer 122 and the partitioning layer 124 may be formed in a separation hole 109 extending, e.g., along the third or Z direction, from the first surface S1 of the light-emitting structure 110 toward the phosphor layers 128, 130, and 132, e.g., to upper surfaces of the phosphor layers 128, 130, and 132. The first separating insulation layer 112-1 and the first metal layer 113-1 may be integrally combined with the second separating insulation layer 112-2 and the second metal layer 113-2, respectively. The first separating insulation layer 112-1, the first metal layer 113-1, the second separating insulation layer 112-2, and the second metal layer 113-2 may constitute the separation layer 122 and the partitioning layer 124. Consequently, the separation layer 122 and the partitioning layer 124 may be integral with each other. The separation layer 122 and the partitioning layer 124 may include the first and second metal layers 113-1 and 113-2, respectively, and the first and second separating insulation layers 112-1 and 112-2, respectively.

Between adjacent groups of light emitting cells for outputting multi-colors, e.g., the three light emitting cells A,B,C, the separation layer 122 may include the first separating insulation layer 112-1 that extends in the third or Z direction between the first metal layer 113-1 for the present group and that of an adjacent group. Similarly, the partitioning layer 124 may include the second separating insulation layer 112-2 that extends in the third or Z direction between the second metal layer 113-2 for the present group and that of an adjacent group. Thus, adjacent groups may be further separated.

The partitioning layer 124 includes the second metal layer 113-2 capable of reflecting light and may be referred to as a metal structure. In other words, the metal structure may be a reflection layer capable of reflecting light. The partitioning layer 124 may include the second separating insulation layer 112-2 and may be referred to as an insulation structure. The partitioning layer 124 including a metal structure or an insulation structure may include a single body.

The partitioning layer 124 may have a sloped sidewall 10. As shown in FIG. 4, a diameter of the space of light-generating portions, e.g., the light-emitting structure 100 and phosphor layers 128, 130, 132, surrounded by the sloped sidewall 10 increases in a direction in which light travels, that is, upward along the third or Z-direction. A sidewall angle 12 of the sloped sidewall 10 may be selected as an angle 14 that is greater than 90 degrees with respect to top surfaces S2 of the light-emitting structures 110 and less than an angle at which the sloped sidewall 10 vertically overlaps with a light-emitting surface of an adjacent light-emitting structure 110, e.g., the surface S2 thereof. The sidewall angle 12 may be a reflection angle of light emitted by the light-emitting structures 110. As described above, the LED device 100 may include the partitioning layer 124 having the sloped sidewall 10 in order to reflect light, thereby increasing light extraction efficiency.

As described above, the LED device 100 includes the plurality of light-emitting cells A, B, and C, and the partitioning layer 124 having the sloped sidewall 10, and further includes the protection layer 127 on the light-emitting structures 110. Accordingly, the LED device 100 may realize a multi-color display, suppress optical interference between the light-emitting cells A, B, and C, and increase light extraction efficiency. In addition, the LED device 100 includes the first metal layer 113-1 and the second metal layer 113-2 in the separation layer 122 and the partitioning layer 124, respectively, thereby increasing light extraction efficiency.

Figure 5:
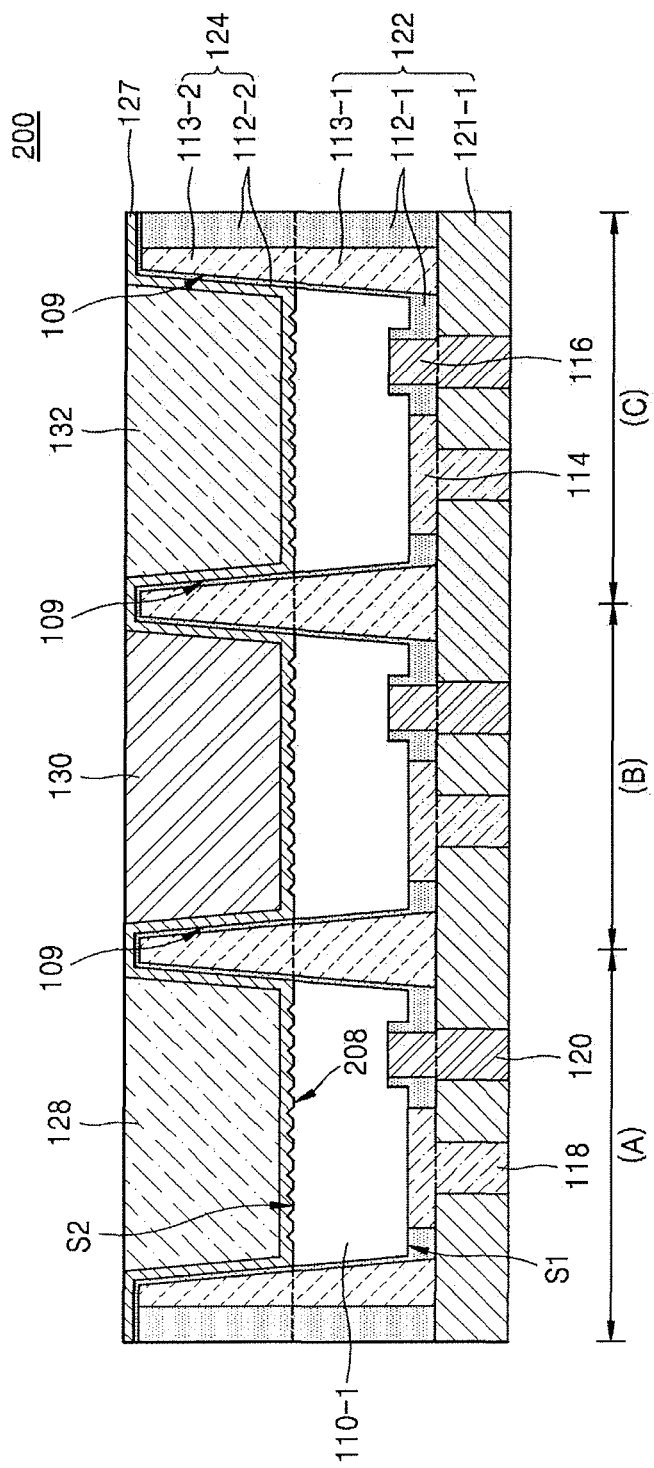
FIG. 5 illustrates a cross-sectional view of a portion of an LED device according to an embodiment.

FIG. 5 is a cross-sectional view of a portion of an LED device 200 according to an embodiment. In detail, the configuration and the effect of the LED device 200 may be identical to those of the LED device 100 of FIGS. 3 and 4 except that the LED device 200 includes a light-emitting structure 110-1 including an uneven structure 208. Therefore, descriptions identical to those given above with reference to FIGS. 3 through 4 will be omitted or briefly given below.

The LED device 200 may include the light-emitting structure 110-1 for each of the light-emitting cells A, B, and C. The uneven structure 208 may be on the second surface S2 of the light-emitting structure 110-1. The protection layer 127 may be formed on the light-emitting structure 110-1 having the uneven structure 208.

When the LED device 200 is manufactured, the protection layer 127 may prevent the uneven structure 208 from being damaged. Accordingly, an uneven structure 208 that is not damaged may be formed on the second surface S2, e.g., a light-emitting surface, of the light-emitting structure 110-1, and thus the LED device 200 may improve light extraction efficiency. Since the configuration of the LED device 200 except the uneven structure 208 is identical to the configuration of the LED device 100 described above with reference to FIG. 4, detailed description thereof will be omitted.

Figure 6:
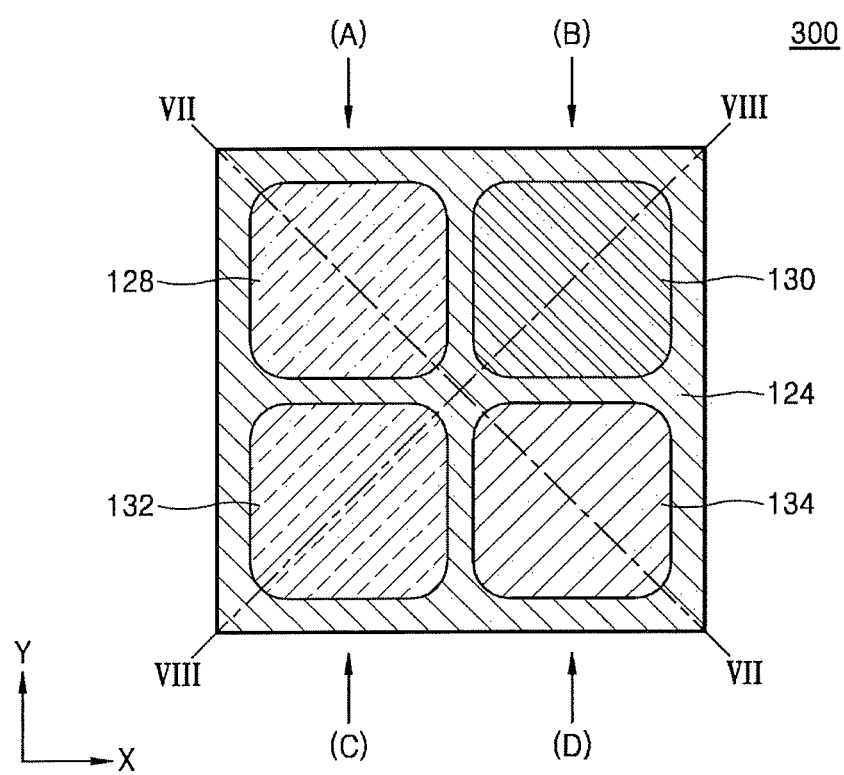
FIG. 6 illustrates a plan view of an LED device according to an embodiment.
Figure 7:
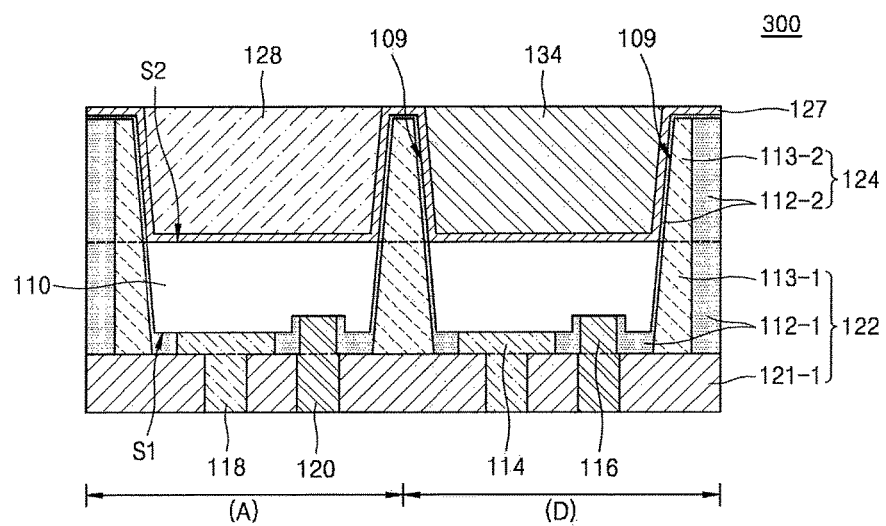
FIGS. 7 and 8 illustrate sectional views of portions of the LED device of FIG. 6, respectively taken along a line VII-VII and a line VIII-VIII.
Figure 8:
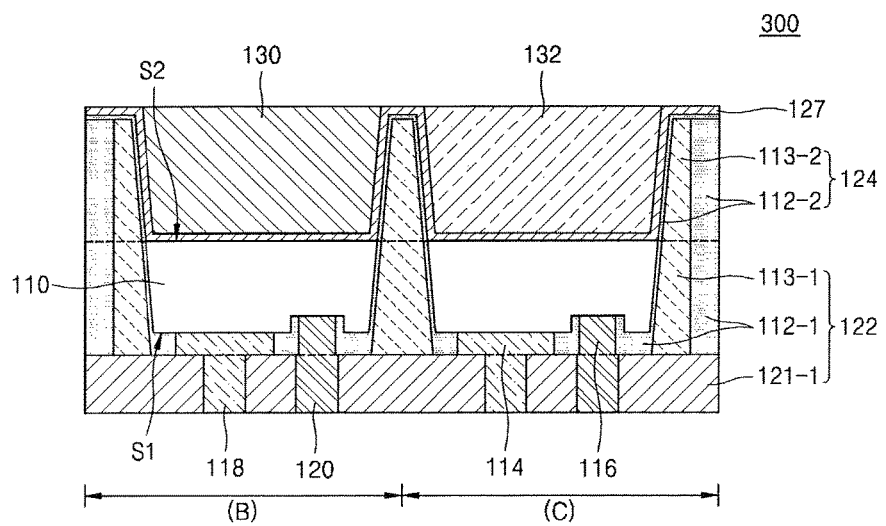

FIG. 6 is a plan view of an LED device 300 according to an embodiment, and FIGS. 7 and 8 are sectional views of portions of the LED device 300 of FIG. 6, respectively obtained along a line VII-VII and a line VIII-VIII.

In detail, the configuration and the effect of the LED device 300 may be identical to those of the LED device 100 of FIGS. 1 through 4 except that the LED device 300 includes a fourth light-emitting cell D. Therefore, descriptions identical to those given above with reference to FIGS. 1 through 4 will be omitted or briefly given below.

As shown in FIG. 6, the LED device 300 may include a plurality of light-emitting cells A, B, C, and D, e.g., a first light-emitting cell A, a second light-emitting cell B, a third light-emitting cell C, and a fourth light-emitting cell D. The first light-emitting cell A and the second light-emitting cell B may be may be spaced apart from and in parallel to each other in the X-axis direction, e.g., in a row. The third light-emitting cell C and the fourth light-emitting cell D may be spaced apart from and in parallel to each other along the X-axis direction, e.g., in a row.

The first light-emitting cell A and the third light-emitting cell C may be spaced apart from and in parallel to each other in the Y-axis direction, e.g., in a column. The second light-emitting cell B and the fourth light-emitting cell D may be spaced apart from and in parallel to each other along the Y-axis direction, e.g., in a column.

The first light-emitting cell A, the second light-emitting cell B, the third light-emitting cell C, and the fourth light-emitting cell D may be disposed as appropriate. Although FIG. 6 shows that the LED device 300 includes the four light-emitting cells A, B, C, and D for convenience of explanation, the LED device 300 may include only two light-emitting cells as needed. In FIG. 6, the light-emitting cells A, B, C, and D may be defined by the partitioning layer 124 extending in both the X-axis direction and the Y-axis direction. The partitioning layer 124 may surround phosphor layers 128, 130, 132, and 134.

As shown in FIGS. 7 and 8, the LED device 300 may include the light-emitting structure 110 for each of the light-emitting cells A, B, C, and D. FIG. 7 shows the first light-emitting cell A and the fourth light-emitting cell D, whereas FIG. 8 shows the second light-emitting cell B and the third light-emitting cell C. As shown in FIG. 6, the light-emitting structure 110 may be apart from one another in a direction, e.g., the X-axis direction or the Y-axis direction. Each of the light-emitting cells A, B, C, and D may include the light-emitting structure 110 that emits light of an ultraviolet wavelength or light of a blue wavelength.

In the LED device 300, the light-emitting structures 110 may be electrically separated from one another and individually driven due to the separation layer 122. The separation layer 122 may separate the light-emitting structures 110 into individual light-emitting cells, e.g., the first light-emitting cell A, the second light-emitting cell B, the third light-emitting cell C, and the fourth light-emitting cell D.

In the LED device 300, the plurality of phosphor layers 128, 130, 132, and 134 having different colors are disposed on the second surfaces S2 of the light-emitting structures 110, respectively. The phosphor layers 128, 130, 132, and 134 may include a blue phosphor layer 128, a green phosphor layer 130, a red phosphor layer 132, and a white phosphor layer 134.

Although FIGS. 6 through 8 show the four phosphor layers 128, 130, 132, and 134 different from one another, two phosphor layers different from each other may be used. The LED device 300 may realize a multi-color display when light emitted by the light-emitting structures 110 pass through the phosphor layers 128, 130, 132, and 134 having different colors.

When the light-emitting structure 110 emits light of a blue wavelength, the LED device 300 may implement three colors even if the LED device 300 includes two phosphor layers. Since the LED device 300 may be electrically separated into the respective light-emitting structures 110 and each of the light-emitting structures 110 may be individually driven, various colors may be implemented as needed.

As described above, the LED device 300 includes the plurality of light-emitting cells A, B, C, and D and the partitioning layer 124 having the sloped sidewall 10 of FIG.

4, and further includes the protection layer 127 on the light-emitting structures 110. Accordingly, the LED device 300 may realize a multi-color display, suppress optical interferences between the light-emitting cells A, B, C, and D, and increase light extraction efficiency due to inclusion of the partitioning layer 124 and the protection layer 127.

Figure 9:
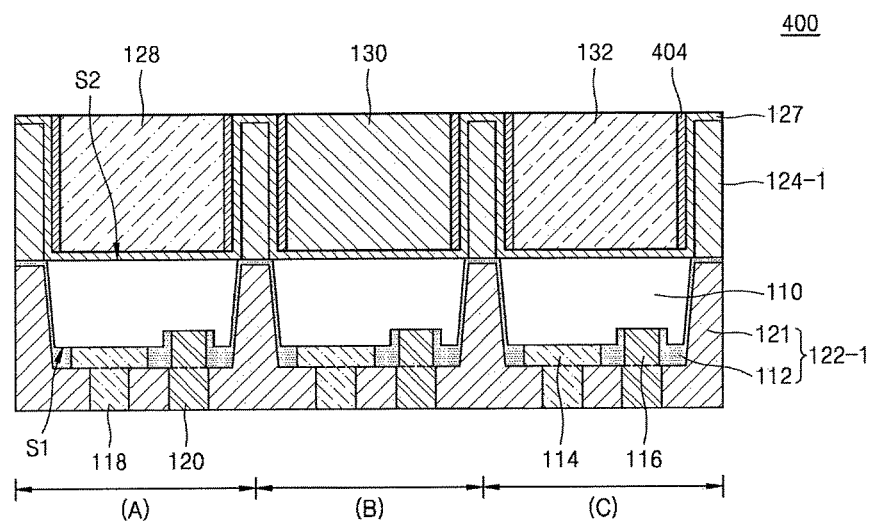
FIG. 9 illustrates a cross-sectional view of a portion of an LED device according to an embodiment.

FIG. 9 is a cross-sectional view of a portion of an LED device 400 according to an embodiment. In detail, the configuration and the effect of the LED device 400 may be identical to those of the LED device 100 of FIGS. 1 through 4 except the structures of a separation layer 122-1 and a partitioning layer 124-1. Therefore, descriptions identical to those given above with reference to FIGS. 1 through 4 will be omitted or briefly given below.

The LED device 400 may include a plurality of light-emitting cells A, B, and C. The LED device 400 may include the light-emitting structure 110 for each of the light-emitting cells A, B, and C. The electrode layers 118 and 120 and the reflective layers 114 and 116 may be disposed on a surface S1 of each of the light-emitting structures 110.

The LED device 400 further includes the separation layer 122-1 for electrically insulating the light-emitting structures 110 from each other, electrically insulating the reflective layers 114 and 116 from each other, and electrically insulating the electrode layers 118 and 120 from each other. The separation layer 122-1 may fill a separation hole 109-1 (see FIG. 18) extending along the third or Z direction from the first surface S1 of each of the light-emitting structures 110 to the second surface S2 thereof. Accordingly, the separation layer 122-1 and the partitioning layer 124-1 may be separate from each other as will be described below.

The separation layer 122-1 may include a separating insulation layer 112 on sidewalls and bottom surfaces of the light-emitting structures 110 and a mold insulation layer 121 insulating the electrode layers 118 and 120 from the light-emitting structures 110. The separating insulation layer 112 may include a silicon oxide layer or a silicon nitride layer. The mold insulation layer 121 may include a silicon resin, an epoxy resin, or an acrylic resin.

Surfaces of the mold insulation layer 121 may overlap surfaces of the light-emitting structure 110, e.g., the mold insulation layer 121 may extend along the light-emitting structure 110 along the Z direction and may overlap portions of the first surfaces S1 where the electrode layers 118 and 120 are not present. The rear surface of the mold insulation layer 121 may overlap surfaces of the electrode layers 118 and 120, e.g., may extend along and between the electrode layers 118 and 120 along the third or Z direction. A rear surface of the mold insulation layer 121 and rear surfaces of the electrode layers 118 and 120 may together form a continuous surface.

The separation layer 122-1 may be disposed at both sides of the light-emitting structure 110 and below the light-emitting structure 110. Due to the separation layer 122-1, the light-emitting structures 110 may be electrically separated from one another and individually driven. The separation layer 122-1 may separate the light-emitting structures 110 into individual light-emitting cells, e.g., the first light-emitting cell A, the second light-emitting cell B, and the third light-emitting cell C, where each of the light-emitting cells A, B, and C may be individually driven.

In the LED device 400, the protection layer 127 for protecting the light-emitting structures 110 may be on second surfaces S2 of the light-emitting structures 110, and a plurality of phosphor layers 128, 130, and 132 having different colors may be on the protection layer 127 so as to respectively correspond to each of the light-emitting structures 110.

In the LED device 400, the partitioning layer 124-1 is between the phosphor layers 128, 130, and 132 to separate the phosphor layers 128, 130, and 132 from one another. The partitioning layer 124-1 may include a single body. The partitioning layer 124-1 may not have a sloped sidewall, in contrast with FIGS. 1-4.

The partitioning layer 124-1 may include a substrate structure. The substrate structure may include a silicon-based substrate structure or an insulation substrate structure. The silicon-based substrate structure may include a silicon substrate or a silicon carbide substrate. The insulation substrate structure may include an insulation substrate containing $MgAl_2O_4$, MgO, $LiAlO_2$, $LiGaO_2$, GaN, AlN, etc. The substrate structure may be referred to as an insulation structure. The separation layer 122-1 and the partitioning layer 124-1 may be separate from each other. Further, the separating insulation layer 112 may be between the partitioning layer 124-1 and the mold insulation layer 121.

The LED device 400 may include a reflection layer 404 on both sidewalls of the phosphor layers 128, 130, and 132, and on one side of the protection layer 127 on the light-emitting structures 110, e.g., may extend along the third or Z direction between the phosphor layers 128, 130, and 132, and the protection layer 127. The reflection layer 404 may overlap a portion of the light-emitting structures 110 in the third or Z direction. The reflection layer 404 may reflect light emitted by the light-emitting structure 110. The reflection layer 404 may be a metal layer, a resin layer containing a metal oxide, or a distributed Bragg reflection layer.

The metal layer may include Al, Au, Ag, Pt, Ni, Cr, Ti, or Cu. The resin layer containing a metal oxide may be a resin layer containing a Ti oxide. The distributed Bragg reflection layer may include from several insulation layers to hundreds of insulation layers (e.g., from 2 to 100 insulation layers) having different refraction indexes and which are repeatedly stacked.

Each of the insulation layers in the distributed Bragg reflection layer may include an oxide or a nitride including $SiO_2$, SiN, SiOxNy, $TiO_2$, $Si_3N_4$, $Al_2O_3$, TiN, AlN, $ZrO_2$, TiAlN, and TiSiN, or a combination thereof. Accordingly, even when the LED device 400 includes the partitioning layer 124-1 having no sloped sidewalls, the LED device 400 may increase light extraction efficiency by including the reflection layer 404.

Figure 10:
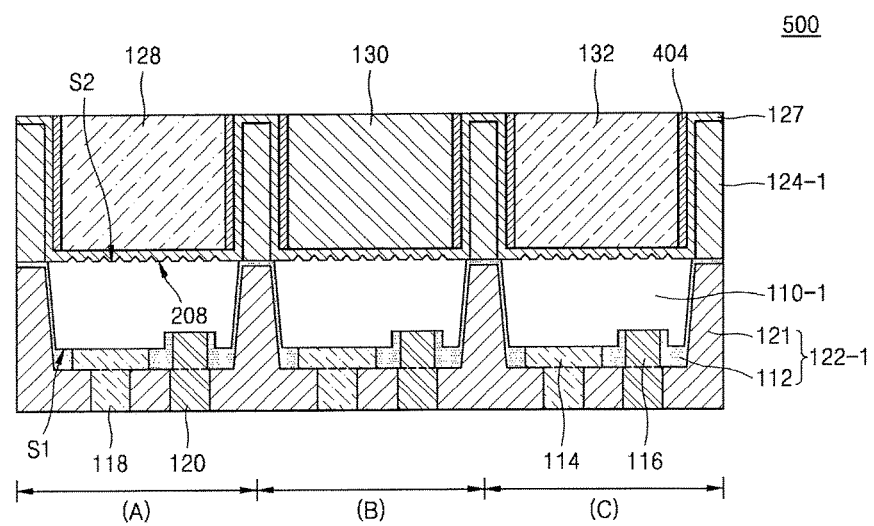
FIG. 10 illustrates a cross-sectional view of a portion of an LED device according to an embodiment.

FIG. 10 is a cross-sectional view of a portion of an LED device 500 according to an embodiment. In detail, the configuration and the effect of the LED device 500 may be identical to those of the LED device 400 of FIG. 9 except that the LED device 500 includes a light-emitting structure 110-1 including the uneven structure 208. Therefore, descriptions identical to those given above with reference to FIG. 9 will be omitted or briefly given below.

The LED device 500 may include the light-emitting structure 110-1 for each of the light-emitting cells A, B, and C. The uneven structure 208 may be on a second surface S2 of the light-emitting structure 110-1. The protection layer 127 may be on the light-emitting structure 110-1 having the uneven structure 208. The uneven structure 208 may be disposed on an upper surface (i.e., the second surface S2) of the light-emitting structure 110-1 and formed in a lower portion of the protection layer 127.

When the LED device 500 is manufactured, the protection layer 127 may prevent the uneven structure 208 from being damaged. Accordingly, an uneven structure 208 that is not damaged may be formed on the second surface S2, for example, a light-emitting surface, of the light-emitting structure 110-1, and thus the LED device 500 may improve light extraction efficiency. Since the configuration of the LED device 500 except the uneven structure 208 is identical to the configuration of the LED device 400 described above with reference to FIG. 9, detailed description thereof will be omitted.

Figure 11:
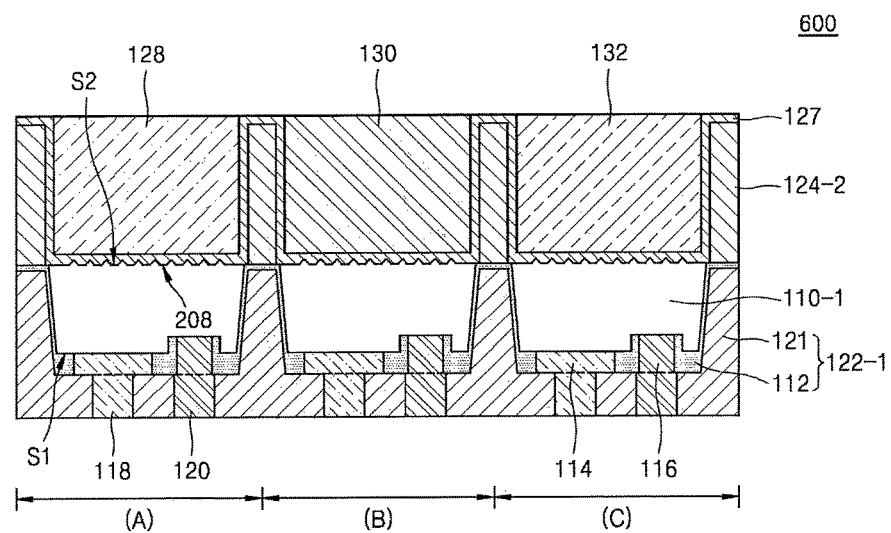
FIG. 11 illustrates a cross-sectional view of a portion of an LED device according to an embodiment.

FIG. 11 is a cross-sectional view of a portion of an LED device 600 according to an embodiment. In detail, the configuration and the effect of the LED device 600 may be identical to those of the LED device 500 of FIG. 10, except that the LED device 600 does not include the reflection layer 404 and includes a partitioning layer 124-2 including a metal structure. Therefore, descriptions identical to those given above with reference to FIG. 10 will be omitted or briefly given below.

In the LED device 600, the partitioning layer 124-2 is between the phosphor layers 128, 130, and 132 to separate the phosphor layers 128, 130, and 132 from one another. The partitioning layer 124-2 may include a metal structure.

The metal structure constituting the partitioning layer 124-2 may include a single body. The metal structure constituting the partitioning layer 124-2 may include a reflection layer as described above. The reflection layer may be a metal layer, a resin layer containing a metal oxide, or a distributed Bragg reflection layer. As described above, the LED device 600 may include the partitioning layer 124-2 including the metal structure to thereby improve light extraction efficiency.

Figure 12:
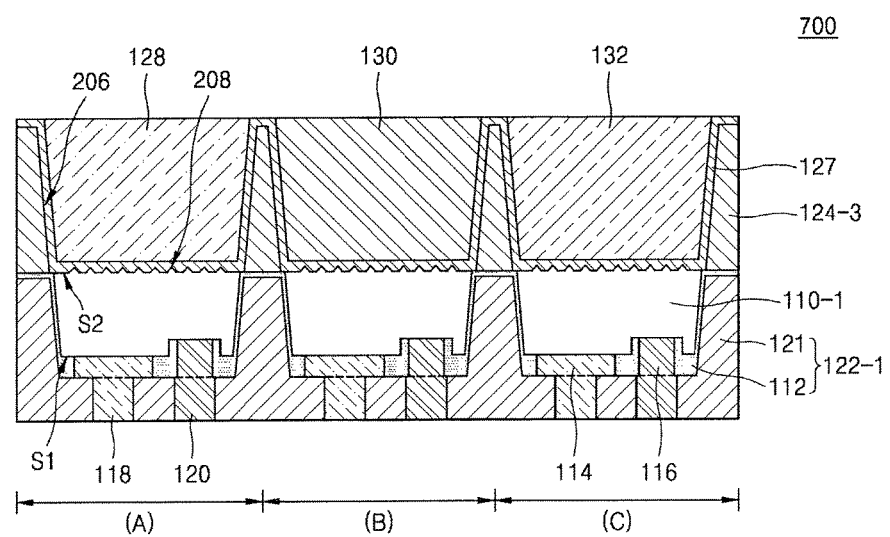
FIG. 12 illustrates a cross-sectional view of a portion of an LED device according to an embodiment.

FIG. 12 is a cross-sectional view of a portion of an LED device 700 according to an embodiment. In detail, the configuration and the effect of the LED device 700 may be identical to those of the LED device 500 of FIG. 10, except that the LED device 700 does not include the reflection layer 404 and includes a partitioning layer 124-3 including a sloped sidewall 206. Therefore, descriptions identical to those given above with reference to FIG. 10 will be omitted or briefly given below.

In the LED device 700, the partitioning layer 124-3 is between the phosphor layers 128, 130, and 132 to separate the phosphor layers 128, 130, and 132 from one another. The partitioning layer 124-3 may suppress optical interferences between the light-emitting cells A, B, and C. The partitioning layer 124-3 may include a substrate structure or an insulation structure.

The partitioning layer 124-3 may have a sloped sidewall 206, wherein a diameter of the light-generating space surrounded by the sloped sidewall 206 increases in a direction in which light travels, that is, upward. The sloped sidewall 206 may improve light extraction efficiency of the LED device 700.

Figure 13:
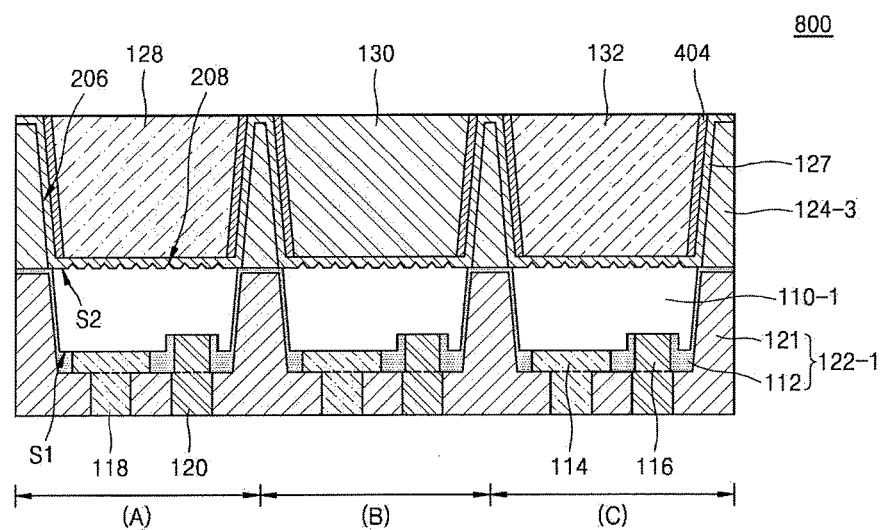
FIG. 13 illustrates a cross-sectional view of a portion of an LED device according to an embodiment.

FIG. 13 is a cross-sectional view of a portion of an LED device 800 according to an embodiment. In detail, the configuration and the effect of the LED device 800 may be identical to those of the LED device 700 of FIG. 12, except that the LED device 800 includes the reflection layer 404. Therefore, descriptions identical to those given above with reference to FIG. 12 will be omitted or briefly given below.

In the LED device 800, the partitioning layer 124-3 having the sloped sidewall 206 is between the phosphor layers 128, 130, and 132 to separate the phosphor layers 128, 130, and 132 from one another. The protection layer 127 may be on the sloped sidewall 206. The reflection layer 404 may be on the protection layer 127. The reflection layer 404 may reflect light emitted by the light-emitting structure 110-1. The reflection layer 404 may include a material as described above. As described above, the LED device 800 may include the partitioning layer 124-3 having the sloped sidewall 206 and the reflection layer 404, thereby increasing light extraction efficiency.

Figure 14:
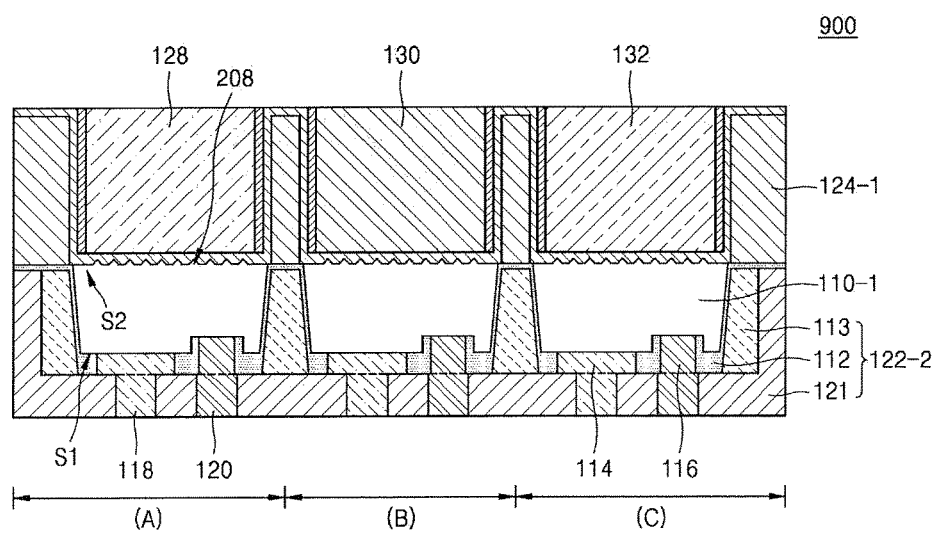
FIG. 14 illustrates a cross-sectional view of a portion of an LED device according to an embodiment.

FIG. 14 is a cross-sectional view of a portion of an LED device 900 according to an embodiment. In detail, the configuration and the effect of the LED device 900 may be identical to those of the LED device 500 of FIG. 10, except that the LED device 900 includes a separation layer 122-2 including a metal layer 113. Therefore, descriptions identical to those given above with reference to FIG. 10 will be omitted or briefly given below.

The LED device 900 includes the separation layer 122-2 for electrically insulating the light-emitting structures 110-1 from each other, electrically insulating the reflective layers 114 and 116 from each other, and electrically insulating the electrode layers 118 and 120 from each other. The separation layer 122-2 may include the separating insulation layer 112 that is formed on the two opposite sidewalls and the bottom surfaces of the light-emitting structures 110-1, a metal layer 113 that is insulated from the light-emitting structure 110-1 by the separating insulation layer 112, and the mold insulation layer 121 that insulates between the electrode layers 118 and 120 and the metal layer 113.

The metal layer 113 may reflect light emitted by the light-emitting structures 110-1. The metal layer 113 may include Al, Au, Ag, Pt, Ni, Cr, Ti, or Cu. As described above, the LED device 800 may include the metal layer 113 in the separation layer 122-2, thereby increasing light extraction efficiency.

Figure 15:
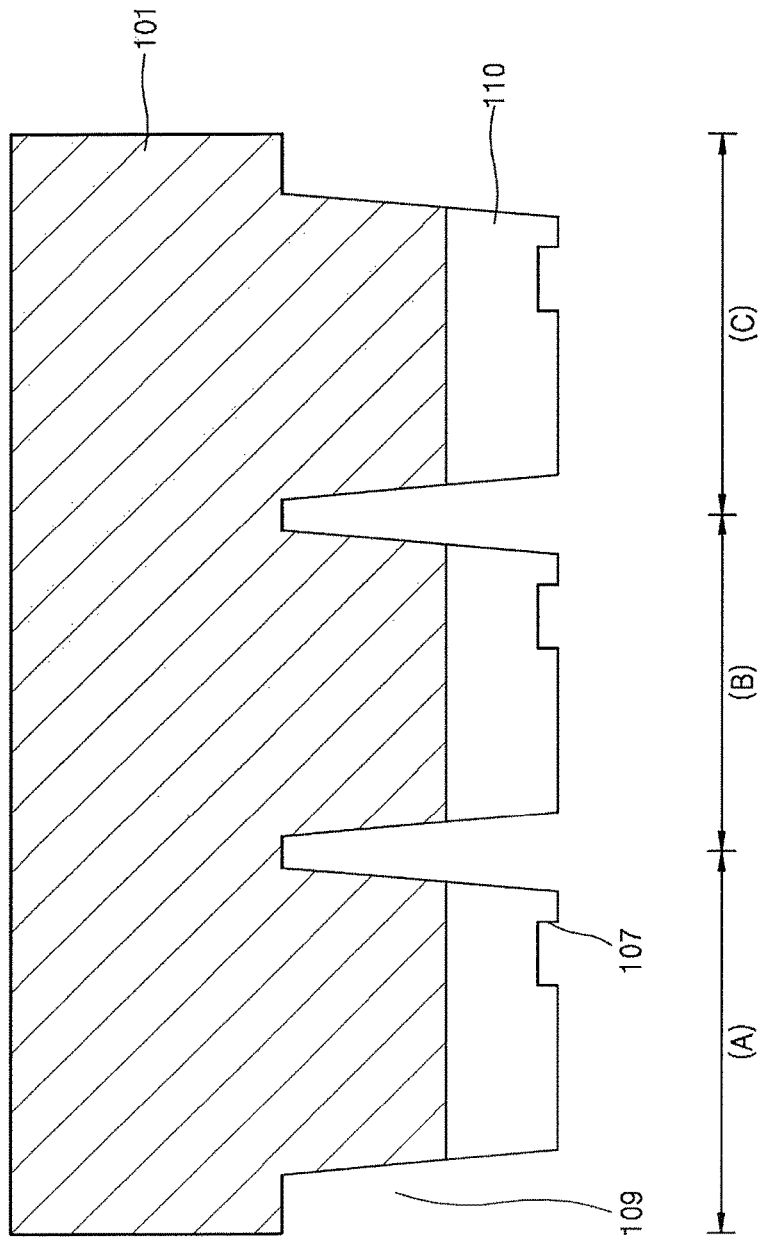
FIGS. 15 through 17 illustrate sectional diagrams for describing stages in a method of fabricating an LED device according to an embodiment.
Figure 16:
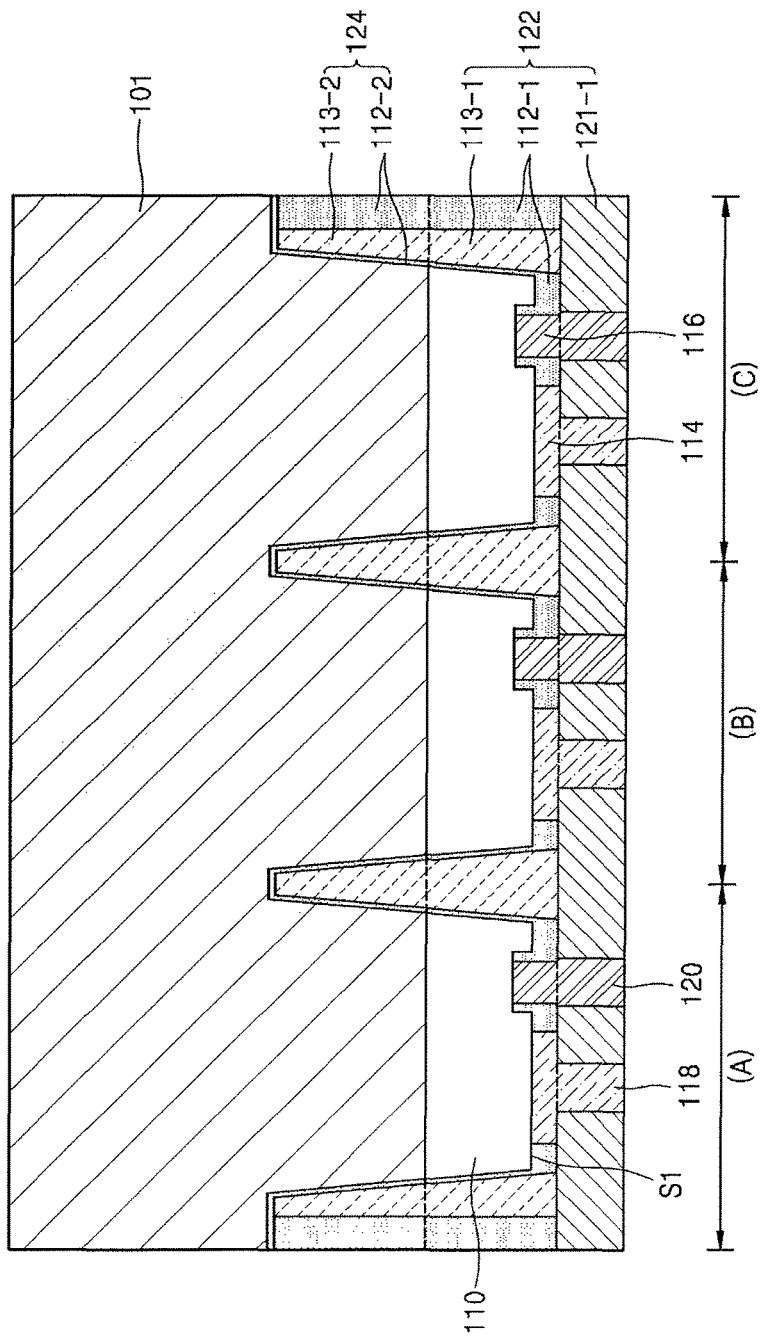
Figure 17:
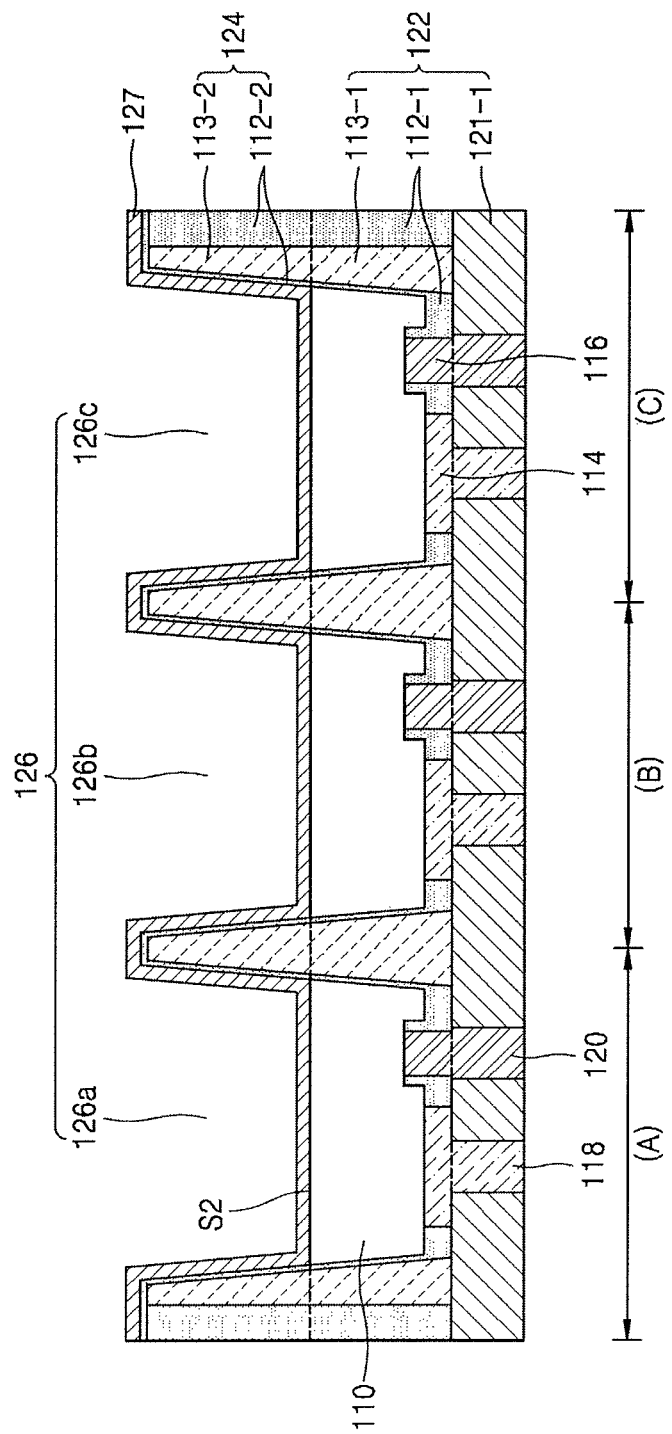

FIGS. 15 through 17 are sectional diagrams for describing a method of fabricating an LED device according to an embodiment. In detail, FIGS. 15 through 17 are sectional diagrams for describing stages in a method of fabricating the LED device 100 of FIG. 3.

Referring to FIG. 15, the light-emitting structures 110 are formed on a substrate 101. The substrate 101 may be a growth substrate for growing the light-emitting structures 110. The substrate 101 may be a semiconductor wafer. The substrate 101 may be a silicon-based substrate. The silicon-based substrate may be a silicon (Si) substrate or a silicon carbide (SiC) substrate. When a silicon-based substrate is used as the substrate 101, the substrate 101 may easily have a large size, and productivity of manufacturing the same may be high due to a relatively inexpensive cost.

The substrate 101 may be an insulation substrate including $MgAl_2O_4$, MgO, $LiAlO_2$, $LiGaO_2$, GaN, AlN, etc. As shown in FIG. 4, each of the light-emitting structures 110 may include the first conductive type semiconductor layer 102, the active layer 104, and the second conductive type semiconductor layer 106.

A separation hole 109 for separating the light-emitting structures 110 from each other is formed. The separation hole 109 may be formed in the substrate 101 to have a certain depth along the third or Z direction. The separation hole 109 may be formed to separate each of the light-emitting cells A, B, and C from one another. A contact hole 107 may be formed in each of the light-emitting structures 110, such that a second electrode layer 120 is connected to a second conductive type semiconductor layer.

Referring to FIGS. 16 and 17, the reflective layers 114 and 116 and the electrode layers 118 and 120 are formed on the first surfaces S1 of the light-emitting structures 110. Next, the separation layer 122 and the partition layer 124 may be simultaneously formed in the separation hole 109.

For example, the separation layer 122 is formed to fill the separation hole 109. The separation layer 122 is formed to electrically insulate the light-emitting structures 110 from each other, to electrically insulate the reflective layers 114 and 116 from each other, and to electrically insulate the electrode layers 118 and 120 from each other.

The separation layer 122 may include the first separating insulation layer 112-1 that is formed on the two opposite sidewalls and the bottom surfaces of the light-emitting structures 110, the first metal layer 113-1 that is insulated from the light-emitting structure 110 by the first separating insulation layer 112-1, and the mold insulation layer 121-1 that insulates the electrode layers 118 and 120 from each other. The mold insulation layer 121-1 may be formed after the first separating insulation layer 112-1 and the first metal layer 113-1 are formed. The first metal layer 113-1 may reflect light emitted by the light-emitting structures 110.

Exposing holes 126 exposing the second surfaces S2 of the light-emitting structures 110 are realized by removing the substrate 101. The exposing holes 126 may include a first sub-exposing hole 126a, a second sub-exposing hole 126b, and a third sub-exposing hole 126c corresponding to the light-emitting cells A, B, and C, respectively.

When the uneven structure is to be included, as shown in FIG. 5, the uneven structure 208 may be formed on a surface of each of the light-emitting structures 110 exposed through each of the exposing holes 126. The protection layer 127 for protecting the light-emitting structures 110 is formed within the exposed holes 126. The protection layer 127 may protect the second surfaces S2 of the light-emitting structures 110 in a subsequent process.

Next, as shown in FIG. 3, the plurality of phosphor layers 128, 130, and 132 having different colors are formed in the exposing holes 126 in correspondence to the light-emitting structures 110, respectively. When the phosphor layers 128, 130, and 132 are formed, the partitioning layer 124 may be formed between the phosphor layers 128, 130, and 132 to separate the phosphor layers 128, 130, and 132 from one another.

As shown in FIGS. 3 and 17, the second separating insulation layer 112-2 and the second metal layer 113-2 respectively extending from the first separating insulation layer 112-1 and the first metal layer 113-1 may be formed on a side surface of each of the phosphor layers 128, 130, and 132. The second separating insulation layer 112-2 and the second metal layer 113-2 may constitute the above-stated partitioning layer 124.

As described above, the partitioning layer 124 may include the second metal layer 113-2 capable of reflecting light and may be referred to as a metal structure. As described above, the partitioning layer 124 may include the second separating insulation layer 112-2 and may be referred to as an insulation structure. The partitioning layer 124 may include a single body.

The first separating insulation layer 112-1 and the first metal layer 113-1 may be integrally combined with the second separating insulation layer 112-2 and the second metal layer 113-2, respectively, in the fabrication operation shown in FIG. 16. When the phosphor layers 128, 130, and 132 are formed, the first separating insulation layer 112-1, the first metal layer 113-1, the second separating insulation layer 112-2, and the second metal layer 113-2 may be combined with one another to form the separation layer 122 and the partitioning layer 124.

FIGS. 18 through 24 are sectional diagrams for describing a method of fabricating an LED device according to an embodiment. In detail, FIGS. 18 through 24 are sectional diagrams for describing a method of fabricating the LED device 400 of FIG. 9. Therefore, descriptions identical to those given above with reference to FIG. 9 will be omitted or briefly given below.

Figure 18:
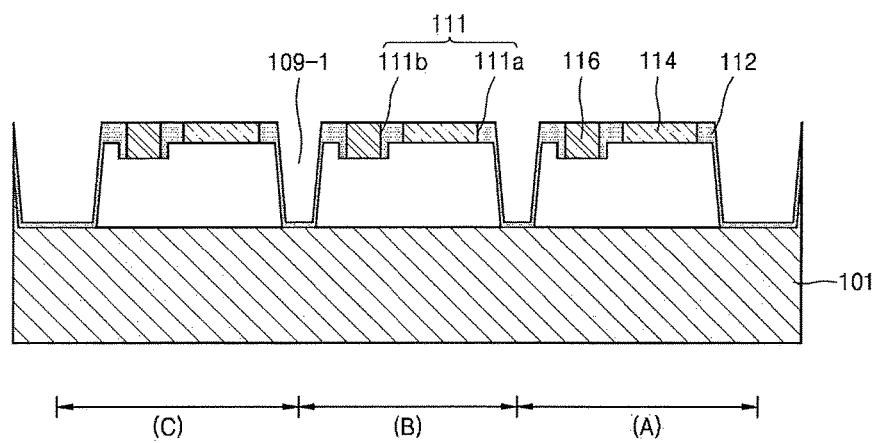
FIGS. 18 through 24 illustrate sectional diagrams for describing stages in a method of fabricating an LED device according to an embodiment.

Referring to FIG. 18, a light-emitting structure 110 is formed on the substrate 101. A separation hole 109-1 separating the light-emitting structure 110 into separate light-emitting structures corresponding to separate, respective light-emitting cells A, B, and C may be formed by selectively etching the light-emitting structure 110. In other words, the separation hole 109-1 that separates the light-emitting structure 110 into a separate light-emitting structure corresponding to the first light-emitting cell A, a separate light-emitting structure corresponding to the second light-emitting cell B, and a separate light-emitting structure corresponding to the third light-emitting cell C is formed.

The separating insulation layer 112 including first exposing holes 111 that expose portions of the light-emitting structure 110 is formed on the inner wall of the separation hole 109-1 and on the light-emitting structure 110. The first exposing holes 111 may include a first sub-exposing hole 111a and a second sub-exposing hole 111b. The separating insulation layer 112 includes a silicon oxide layer or a silicon nitride layer. The separating insulation layer 112 may be formed on a sidewall and a top surface of each light-emitting structure 110. The first sub-exposing hole 111a may be a hole that exposes a first conductive type semiconductor layer, e.g., a P-type semiconductor layer. The second sub-exposing hole 111b may be a hole that exposes a second conductive type semiconductor layer, e.g., an N-type semiconductor layer.

The reflective layers 114 and 116 are formed in the exposing holes 111. The reflective layers 114 and 116 may include highly-reflective material layers, e.g., metal layers. The reflective layers 114 and 116 may include Al, Au, Ag, Pt, Ni, Cr, Ti, or Cu. The first reflective layer 114 and the second reflective layer 116 are formed in the first sub-exposing hole 111a and the second sub-exposing hole 111b, respectively. The reflective layers 114 and 116 may reflect light emitted by the light-emitting structure and function as electrode layers.

Figure 19:
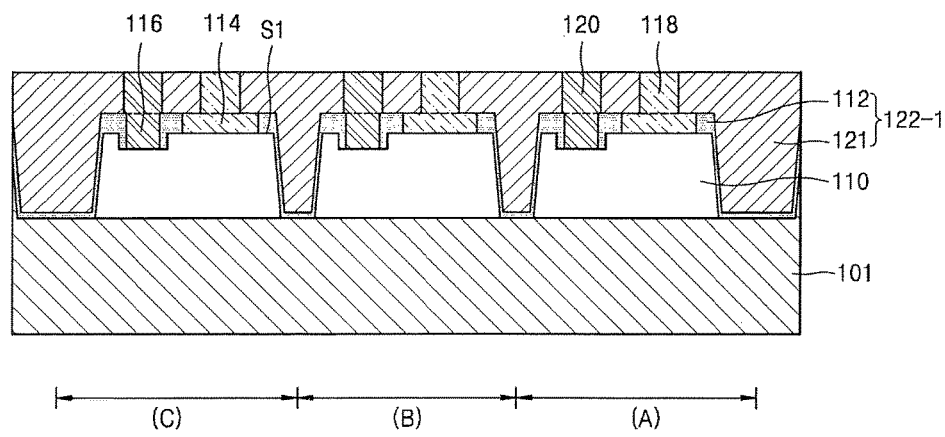

Referring to FIG. 19, electrode layers 118 and 120 are formed on the reflective layers 114 and 116. In other words, the first electrode layer 118 and the second electrode layer 120 are formed on the first reflective layer 114 and the second reflective layer 116, respectively. The first electrode layer 118 may be electrically connected to the first conductive type semiconductor layer 102 shown in FIG. 4, whereas the second electrode layer 120 may be electrically connected to the second conductive type semiconductor layer 106 shown in FIG. 4.

The first and second electrode layers 118 and 120 may include the same material as the first and second reflective layers 114 and 116. Accordingly, the electrode layers 118 and 120 and the reflective layers 114 and 116 may be disposed on a surface S1 of each of the light-emitting structures 110.

Next, the mold insulation layer 121 that electrically insulates between the electrode layers 118 and 120 and the light-emitting structures 110 is formed. The mold insulation layer 121 may include a silicon resin, an epoxy resin, or an acrylic resin. The upper surface of the mold insulation layer 121 and surfaces of the electrode layers 118 and 120 may form a continuous surface. Accordingly, the separating insulation layer 112 and the mold insulation layer 121 may constitute the separation layer 122-1 that electrically insulates the light-emitting cells A, B, and C from one another.

Figure 20:
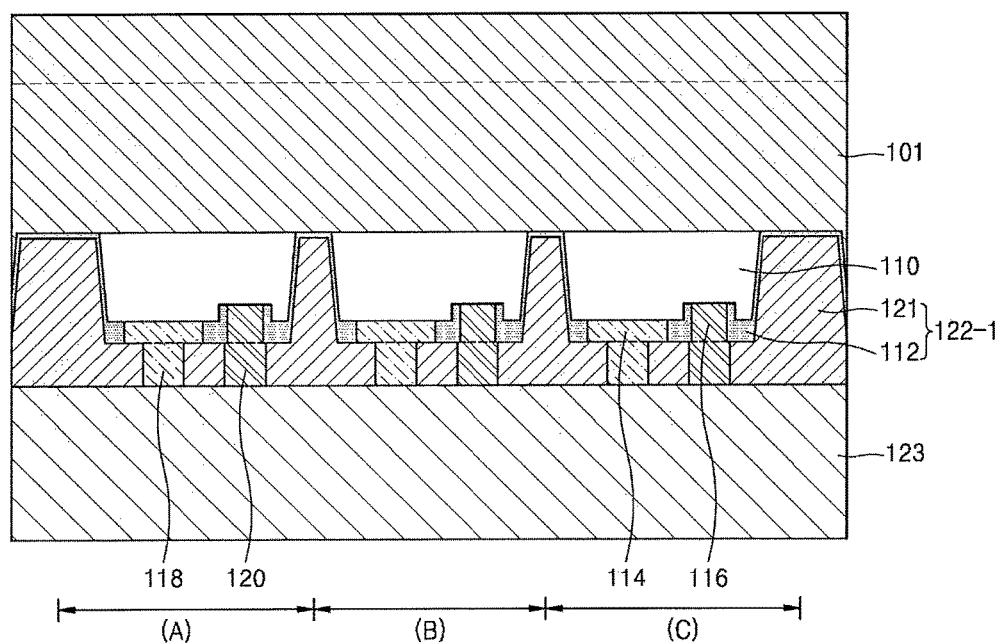

Referring to FIG. 20, a temporary substrate 123 is attached onto the electrode layers 118 and 120 and the separation layer 122-1. The temporary substrate 123 may be a substrate for supporting the electrode layers 118 and 120 and the separation layer 122-1. The temporary substrate 123 may be a glass substrate or an insulation substrate.

Next, the structure is turned upside down (e.g., inverted), such that the temporary substrate 123 faces downward, and the thickness of the structure is reduced by grinding the rear surface of the substrate 101. When the rear surface of the substrate 101 is ground as described above, the rear surface of the substrate 101 is planarized and the substrate 101 becomes thinner.

Figure 21:
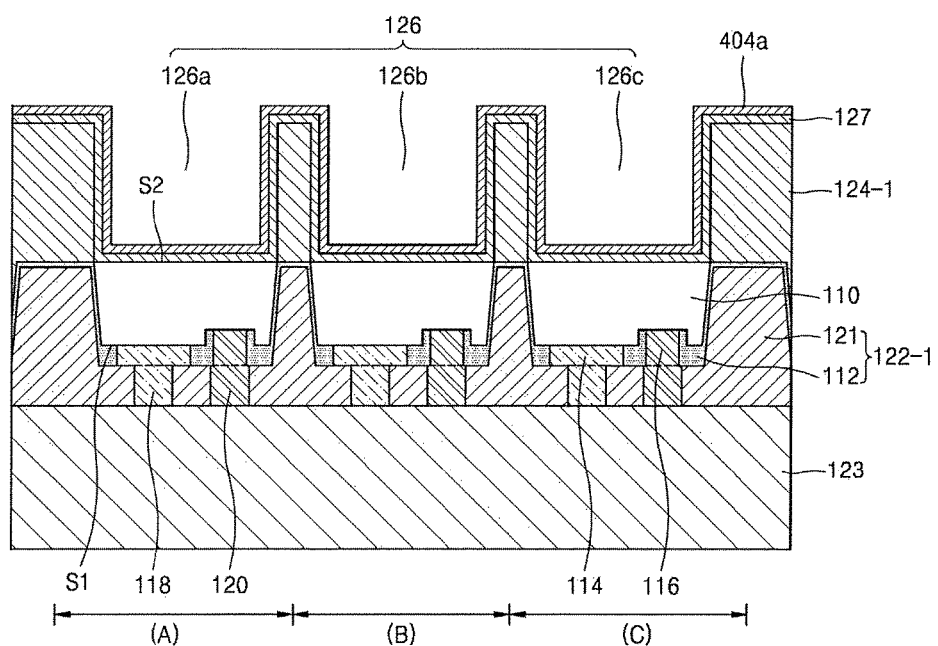
Figure 22:
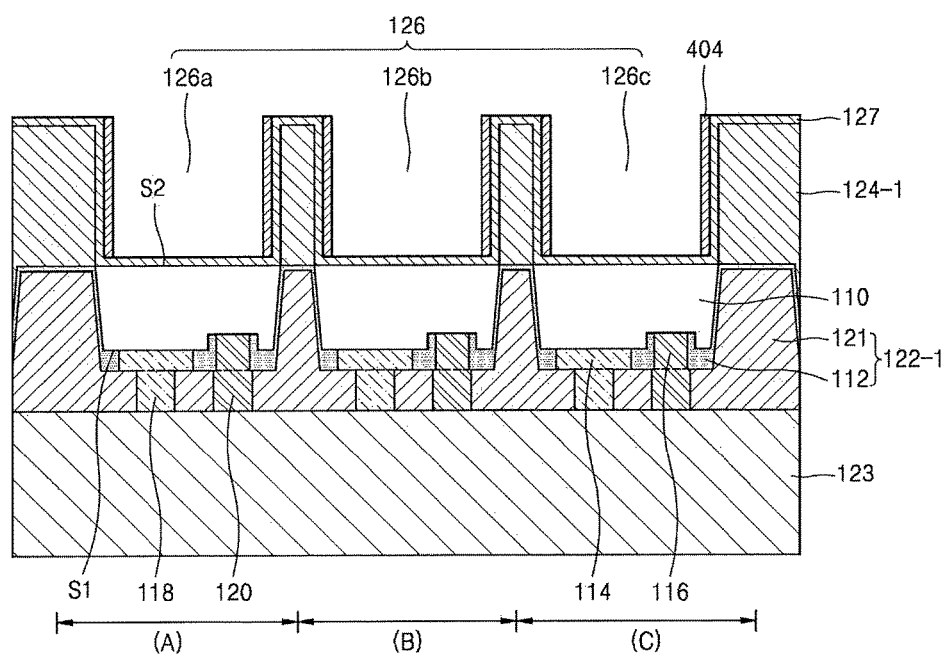

Referring to FIGS. 21 and 22, the partitioning layer 124-1 including exposing holes 126 that exposes the surfaces S2 of the light-emitting structures 110 is formed by selectively etching the substrate 101. The exposing holes 126 may include a first sub-exposing hole 126a, a second sub-exposing hole 126b, and a third sub-exposing hole 126c corresponding to the light-emitting cells A, B, and C, respectively.

The partitioning layer 124-1 may include a substrate structure or an insulation structure. The partitioning layer 124-1 may include a single body. The partitioning layer 124-1 may include a silicon-based substrate structure or an insulation substrate structure based on a material constituting the substrate 101. Since the partitioning layer 124-1 according to the present embodiment includes a silicon-based substrate structure or an insulation substrate structure, it is not necessary to perform a separate stacking operation, and thus the overall fabrication process may be simplified. Furthermore, size of the partitioning layer 124 may be easily controlled.

Then, the protection layer 127 is formed on surfaces of the light-emitting structures 110 and a side surface and an upper surface of the partitioning layer 124-1. The protection layer 127 is formed to protect the surfaces of the light-emitting structures 110 in a subsequent process. Then, a light-reflecting material layer 404a may be formed on the protection layer 127. The light-reflecting material layer 404a may be formed of the aforementioned material used to form the reflection layer 404.

Then, as shown in FIG. 22, the reflection layer 404 is formed by etching the light-reflecting material layer 404a. When the light-reflecting material layer 404a is etched, the light-reflecting material layer 404a formed on the surface of the light-emitting structure 110 and the surface of the partitioning layer 124-1 may be removed. The reflection layer 404 may be formed on a side surface of the partitioning layer 124-1.

Figure 23:
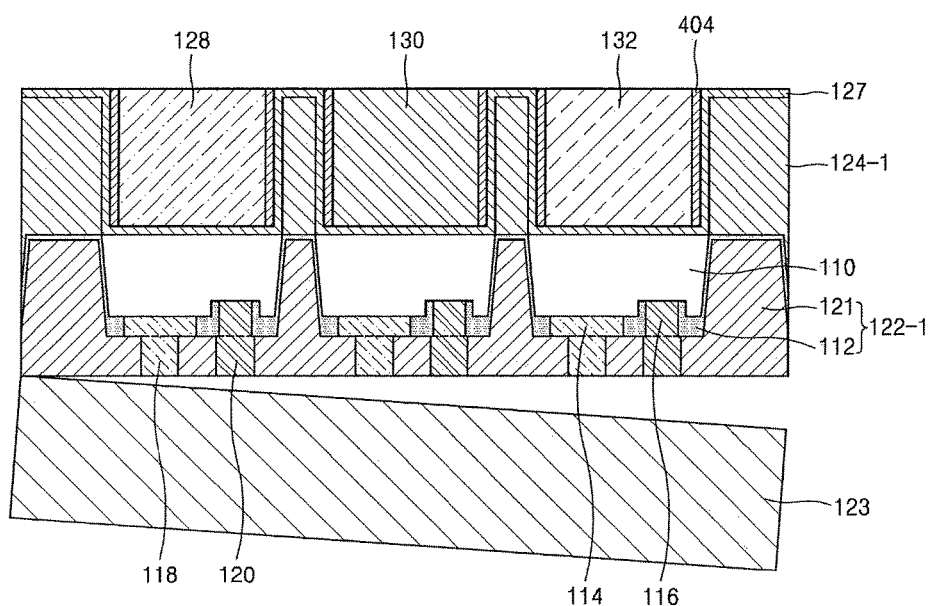

Referring to FIG. 23, the phosphor layers 128, 130, and 132 are formed on the protection layer 127 within the exposing holes 126 on the light-emitting structures 110, respectively. The blue phosphor layer 128, the green phosphor layer 130, and the red phosphor layer 132 are formed in the first sub-exposing hole 126a, the second sub-exposing hole 126b, and the third sub-exposing hole 126c, respectively. Accordingly, the phosphor layers 128, 130, and 132 may include the blue phosphor layer 128, the green phosphor layer 130, and the red phosphor layer 132. Then, the temporary substrate 123 is removed.

Figure 24:
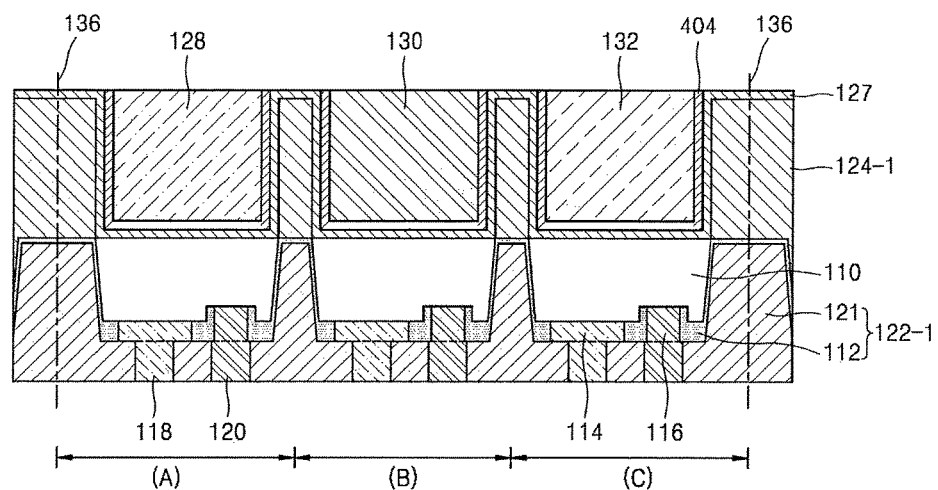

Referring to FIG. 24, the LED device 400 is completed by dicing the partitioning layer 124-1 and the separation layer 122-1 along a dicing line 136, such that the LED device 400 includes the plurality of light-emitting cells A, B, and C.

Figure 25:
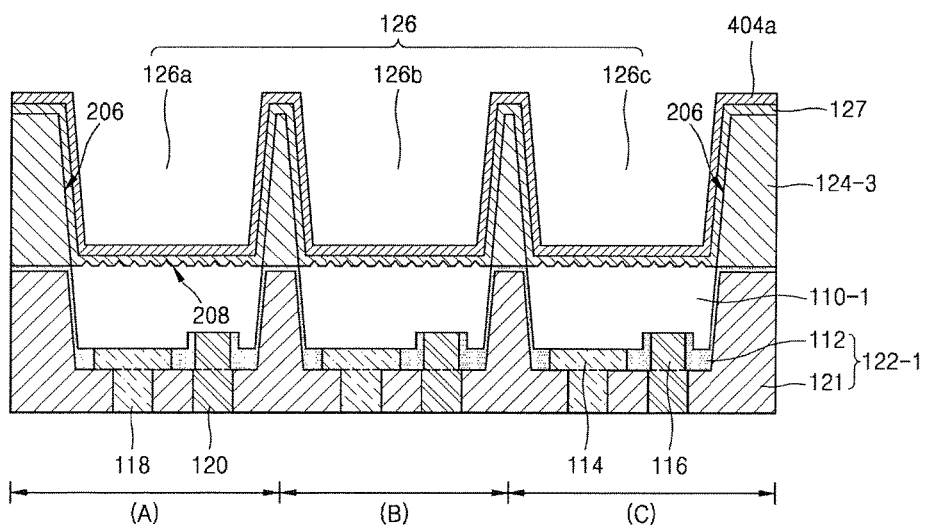
FIGS. 25 and 26 illustrate sectional diagrams for describing stages in a method of fabricating an LED device according to an embodiment.
Figure 26:
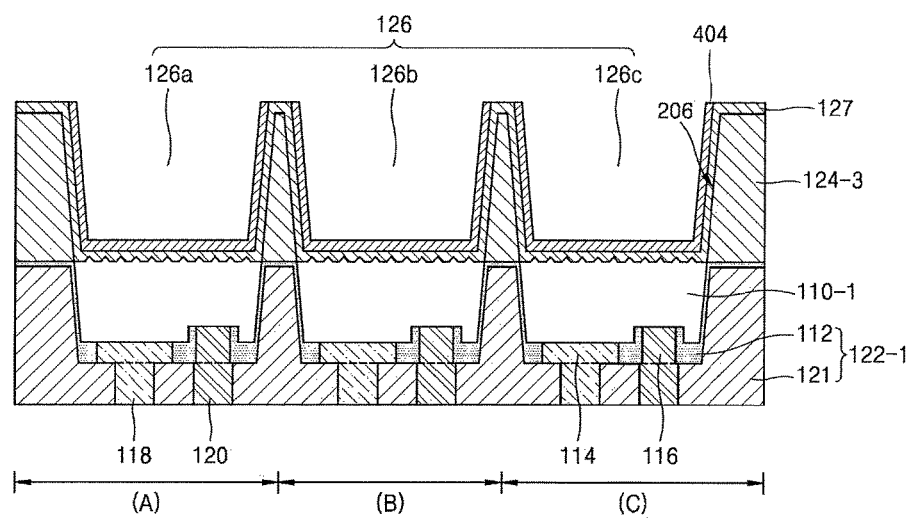

FIGS. 25 and 26 are sectional diagrams for describing stages in a method of fabricating an LED device according to an embodiment. In detail, FIGS. 25 and 26 are sectional diagrams for describing a method of fabricating the LED device 800 of FIG. 13. The method shown in FIGS. 25 and 26 may be identical to the method shown in FIGS. 18 through 24 except that a sidewall of the partitioning layer 124-3 is the sloped sidewall 206 and the uneven structure 208 is formed on a surface of the light-emitting structure 110-1. Therefore, descriptions identical to those given above with reference to FIGS. 18 through 24 will be omitted or briefly given below.

As shown in FIG. 25, the partitioning layer 124-3 including the exposing holes 126 that expose the surfaces S2 of the light-emitting structures 110-1 is formed. The exposing holes 126 may include the first sub-exposing hole 126a, the second sub-exposing hole 126b, and the third sub-exposing hole 126c corresponding to the light-emitting cells A, B, and C, respectively.

As shown in FIG. 25, during formation of the partitioning layer 124-3, a sidewall of the partitioning layer 124-3 is formed as the sloped sidewall 206. Due to the sloped sidewall 206 of the partitioning layer 124-3, a diameter of the space surrounded by the sloped sidewall 206 may increase in a direction in which light travels (that is, upward). Therefore, light extraction efficiency of the LED device 800 may be improved. Then, the uneven structure 208 is formed by etching a surface of the light-emitting structure 110-1. The uneven structure 208 is formed to improve an efficiency for extracting light emitted by the light-emitting structure 110-1.

Then, the protection layer 127 is formed on surfaces of the light-emitting structures 110-1 and a side surface and an upper surface of the partitioning layer 124-3. The protection layer 127 is formed to protect the surfaces of the light-emitting structures 110-1 in a subsequent process. Then, the light-reflecting material layer 404a may be formed on the protection layer 127. The light-reflecting material layer 404a may be formed of the aforementioned material used to form the reflection layer 404.

Then, as shown in FIG. 26, the reflection layer 404 is formed by etching the light-reflecting material layer 404a. When the light reflecting material layer 404a is etched, the light-reflecting material layer 404a formed on the surface of the light-emitting structure 110 and the surface of the partitioning layer 124-3 may be removed. The reflection layer 404 may be formed on a side surface of the partitioning layer 124-3. Thereafter, as shown in FIG. 13, the LED device 800 (FIG. 13) may be completed by forming the phosphor layers 128, 130, and 132 in the exposing holes 126.

FIGS. 27 through 30 are sectional diagrams for describing stages in a method of fabricating an LED device according to an embodiment. In detail, FIGS. 27 through 30 are sectional diagrams for describing a method of fabricating the LED device 900 of FIG. 14. The method shown in FIGS. 27 through 30 may be identical to the method shown in FIGS. 18 through 24 except that the LED device 900 includes the light-emitting structure 110-1 including the uneven structure 208 and the separation layer 122-2 including the metal layer 113. Therefore, descriptions identical to those given above with reference to FIGS. 18 through 24 will be omitted or briefly given below.

Figure 27:
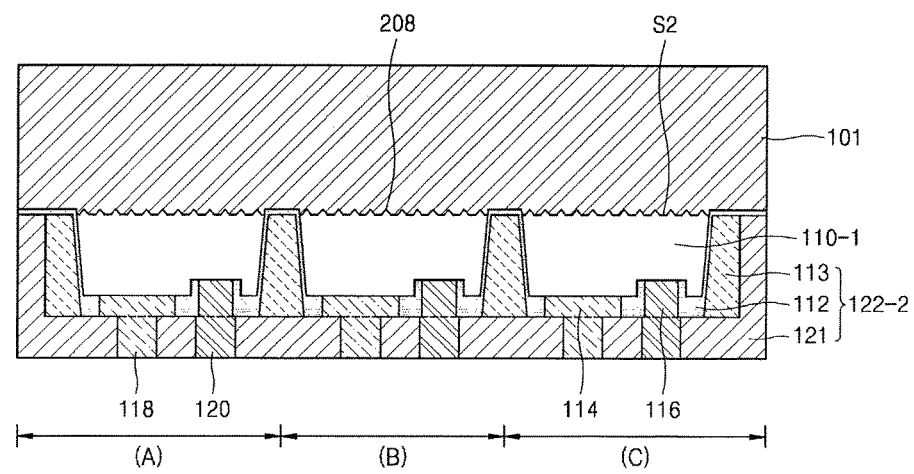
FIGS. 27 through 30 illustrate sectional diagrams for describing stages in a method of fabricating an LED device according to an embodiment.

Referring to FIG. 27, the light-emitting structures 110-1 and the separation layer 122-2 that electrically separates the light-emitting structures 110-1 from one another are formed. However, as shown in FIG. 27, the uneven structure 208 is formed on the surfaces S2 (e.g., the upper surfaces) of the light-emitting structures 110-1. When a corresponding uneven structure is formed on the substrate 101, the uneven structure 208 may be formed on the light-emitting structure 110-1 in correspondence to the uneven structure formed on the substrate 101.

The separation layer 122-2 may include the separating insulation layer 112 that is formed on the two opposite sidewalls and the bottom surfaces of the light-emitting structures 110-1, the metal layer 113 that is insulated from the light-emitting structure 110-1 by the separating insulation layer 112, and the mold insulation layer 121 that insulates between the electrode layers 118 and 120 and the metal layer 113.

Figure 28:
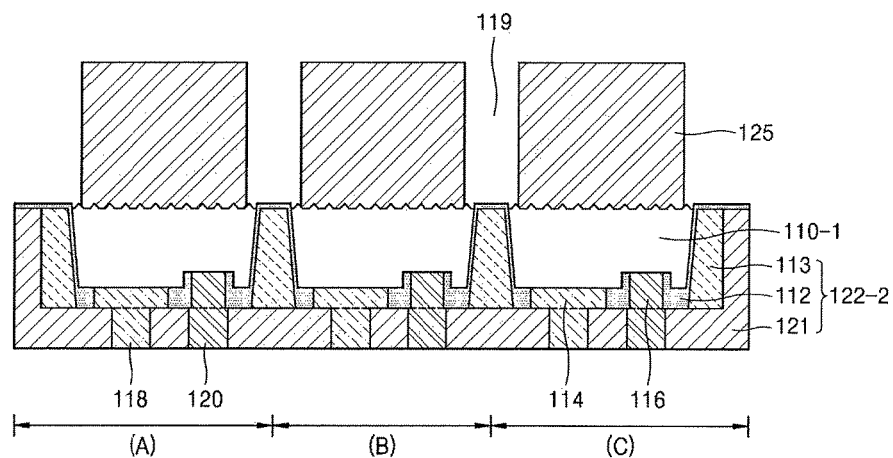

Referring to FIG. 28, a substrate sacrificing layer 125 including a separating exposing hole 119 that exposes the separation layer 122-2 is formed by etching the substrate 101. The substrate sacrificing layer 125 may be formed on the light-emitting structures 110-1. The substrate sacrificing layer 125 may include a silicon substrate or an insulation substrate.

Figure 29:
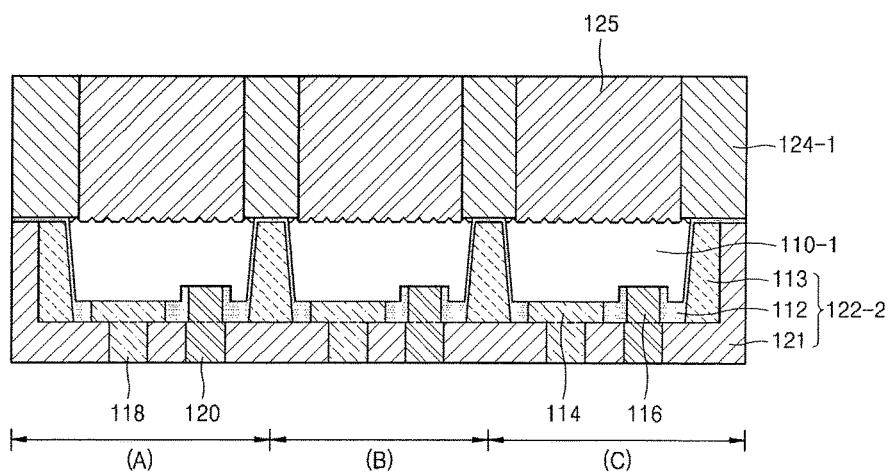
Figure 30:
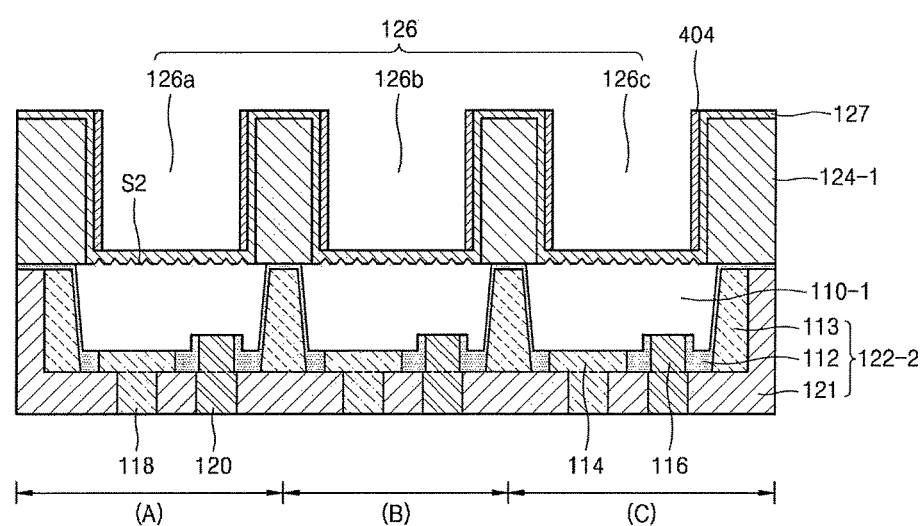

Referring to FIGS. 29 and 30, the partitioning layer 124-1 is formed of an insulating material in the separating exposing hole 119 as shown in FIG. 29. The partitioning layer 124-1 may include a single body. The partitioning layer 124-1 may be formed to fill the separating exposing hole 119 on the separation layer 122-2. Then, as shown in FIG. 30, the partition layer 124-1 including the exposing holes 126 that expose the surfaces S2 of the light-emitting structures 110-1 is formed by removing the substrate sacrificing layer 125. The partitioning layer 124-1 may include an insulating structure.

The exposing holes 126 may include the first sub-exposing hole 126a, the second sub-exposing hole 126b, and the third sub-exposing hole 126c corresponding to the light-emitting cells A, B, and C, respectively.

Then, as described above, the protection layer 127 is formed on surfaces of the light-emitting structures 110-1 and a side surface of the partitioning layer 124-1. The reflection layer 404 is also formed on the protection layer 127 on a side surface of the partitioning layer 124-1. Thereafter, as shown in FIG. 14, the LED device 900 (FIG. 14) may be completed by forming the phosphor layers 128, 130, and 132 in the exposing holes 126.

Figure 31:
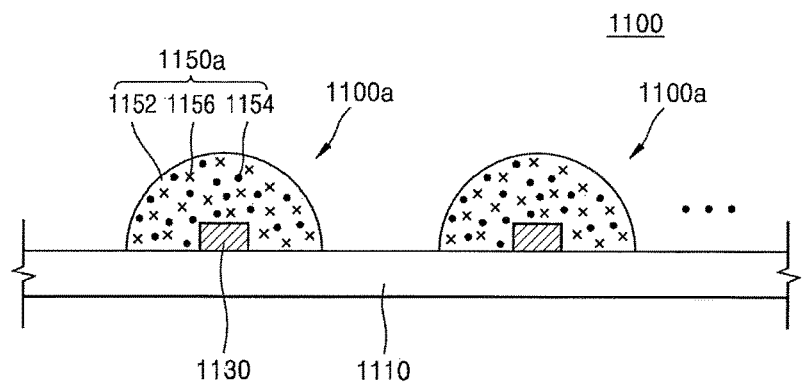
FIGS. 31 and 32 illustrate schematic sectional views of a white light source module including an LED device, according to an embodiment.
Figure 32:
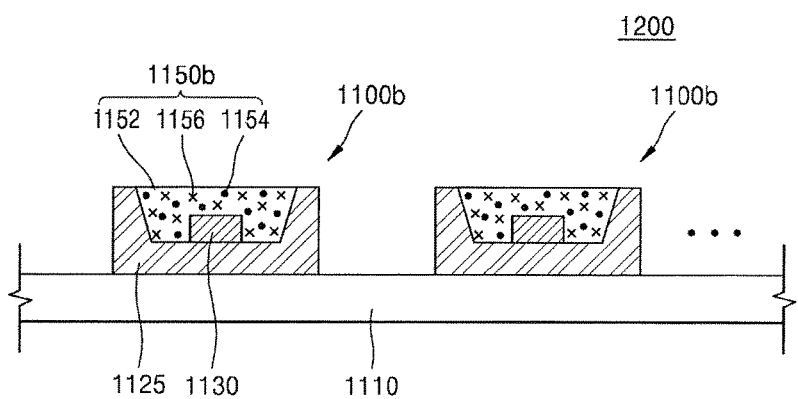

FIGS. 31 and 32 are schematic sectional views of a white light source module including an LED device according to an embodiment. Referring to FIG. 31, a liquid crystal display (LCD) backlight light source module 1100 may include a circuit board 1110 and an array including a plurality of white LED devices 1100a mounted on the circuit board 1110. A conductive pattern to be connected to the white LED devices 1100a may be disposed on the upper surface of the circuit board 1110.

Each of the white LED devices 1100a may have a structure in which an LED device 1130 emitting blue light is directly mounted on the circuit board 1110 as a chip on board (COB). The LED device 1130 may be at least any one of the LED devices 100 through 900 according to the above embodiments. Each of the white LED devices 1100a may have a hemispheric shape that a wavelength transformer 1150a functions as a lens, thereby exhibiting a wide beam opening angle. Such a wide beam opening angle may contribute to reduction of the thickness or the width of a LCD display apparatus.

Referring to FIG. 32, a LCD backlight light source module 1200 may include the circuit board 1110 and an array including a plurality of white LED devices 1100b mounted on the circuit board 1110. Each of the white LED devices 1100b may include an LED device 1130 that is mounted inside a reflective cup of a package main unit 1125 and emits blue light, and a wavelength transformer 1150b that encapsulates the LED device 1130. The LED device 1130 may be at least any one of the LED devices 100 through 900 according to the above embodiments.

The wavelength transformers 1150a and 1150b may include a phosphor and/or wavelength transforming materials 1152, 1154, and 1156 as an occasion demands.

By way of summation and review, a light-emitting diode (LED) device that includes a plurality of light-emitting cells for realizing multi-colors, suppresses optical interference between the light-emitting cells, and has improved light extraction efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A light-emitting diode (LED) device, comprising:
   a plurality of light-emitting structures spaced apart from each other;
   a plurality of electrode layers on first surfaces of the plurality of light-emitting structures, respectively;
   a protection layer on second surfaces of the plurality of light-emitting structures, respectively;
   a separation layer to electrically insulate the plurality of light-emitting structures from each other and electrically insulate the plurality of electrode layers from each other;
   a plurality of phosphor layers on the protection layer on the second surfaces of the plurality of light-emitting structures, respectively, such that the protection layer is between the phosphor layer and the light emitting structure, each of the plurality of phosphor layers to output a different color of light; and
   a partitioning layer between the plurality of phosphor layers and separating the plurality of phosphor layers from each other, the partitioning layer including a substrate structure, an insulation structure, or a metal structure.

2. The LED device as claimed in claim 1, wherein the separation layer and the partitioning layer are included in a common layer.

3. The LED device as claimed in claim 2, wherein the separation layer and the partitioning layer fill a separation hole that extends from the first surface of each of the plurality of light-emitting structures toward each of the plurality of phosphor layers.

4. The LED device as claimed in claim 2, wherein the separation layer and the partitioning layer include a metal layer and an insulation layer that surrounds the metal layer.

5. The LED device of claim 1, wherein, on each of the plurality of light-emitting structures, a sidewall of the partitioning layer is a sloped sidewall such that a diameter of a space of each of the plurality of light-emitting structures surrounded by the sidewall increases in a direction in which light travels.

6. The LED device as claimed in claim 1, wherein the protection layer is on a sidewall and an upper surface of the partitioning layer.

7. The LED device as claimed in claim 1, wherein the separation layer and the partitioning layer are separate layers.

8. The LED device as claimed in claim 1, wherein the separation layer fills a separation hole extending from the first surfaces of the plurality of light-emitting structures toward the second surfaces of the plurality of light-emitting structures.

9. The LED device as claimed in claim 1, wherein the substrate structure, the insulation structure, or the metal structure of the partitioning layer is a single body structure.

10. The LED device as claimed in claim 1, further comprising a reflection layer on a sidewall of the partitioning layer.

11. The LED device as claimed in claim 1, further comprising a reflective layer between each of the plurality of electrode layers and each of the plurality of light-emitting structures.

12. The LED device as claimed in claim 1, further comprising an uneven structure on the second surface of each of the plurality of light-emitting structures, the uneven structure formed in a lower portion of the protection layer.

13. A light-emitting diode (LED) device, comprising:
a plurality of light-emitting structures spaced apart from one another;
a plurality of electrode layers on first surfaces of the plurality of light-emitting structures, respectively;
a separation layer and a partitioning layer included in a common layer that fills a separation hole extending from the first surfaces of the plurality of light-emitting structures down to second surfaces of the plurality of light-emitting structures, the separation hole to separate light-emitting structures from each other;
a protection layer on second surfaces of the plurality of light-emitting structures, respectively; and
a plurality of phosphor layers respectively on the second surfaces of the plurality of light-emitting structures separated from one another by the partitioning layers, the plurality of phosphor layers associated with different colors,
wherein the partition layer includes at least one of a substrate structure, an insulation structure, and a metal structure, and a sidewall of the partitioning layer is sloped such that a diameter of a space of each of the plurality of light-emitting structures surrounded by the sidewall increases in a direction in which light travels.

14. The LED device as claimed in claim 13, wherein the separation layer includes:
a first separating insulation layer on first sidewalls and first surfaces of the light-emitting structures;
a first metal layer insulated from the light-emitting structures by the first separating insulation layer; and
a mold insulation layer to insulate the first electrode layers from each other.

15. The LED device as claimed in claim 14, wherein the partitioning layer includes a second separating insulation layer and a second metal layer on sidewalls of each of the plurality of phosphor layers, the second separating insulation layer and the second metal layer respectively extending from the first separating insulation layer and the first metal layer.

16. The LED device as claimed in claim 15, wherein:
the first separating insulation layer and the second separating insulation layer are included in a common separating insulation layer,
the first metal layer and the second metal layer are included in a common metal layer,
the separation layer includes the first separating insulation layer and the first metal layer, and
the partitioning layer includes the second separating insulation layer and the second metal layer.

17. The LED device as claimed in claim 13, further comprising a reflection layer on a sidewall of the partitioning layer.

18. A light-emitting diode (LED) device, comprising:
a plurality of light-emitting structures spaced apart from each other;
a plurality of electrode layers on first surfaces of the plurality of light-emitting structures, respectively;
a protection layer on second surfaces of the plurality of light-emitting structures, respectively; and
a separation layer that fills a separation hole extending from the first surfaces of the plurality of light-emitting structures to second surfaces of the plurality of light-emitting structures, respectively, wherein the separation layer includes:
a separating insulation layer on sidewalls and lower surfaces of the light-emitting structures; and
a metal layer insulated from the plurality of light-emitting structures by the separating insulation layer.

19. The LED device as claimed in claim 18, wherein the separation layer includes a mold insulation layer to insulate the plurality of electrode layers from each other.

20. The LED device as claimed in claim 18, further comprising:
a plurality of phosphor layers on the protection layer on the second surfaces of the plurality of light-emitting structures, respectively, each of the plurality of phosphor layers to output different colors of light; and
a partitioning layer between the plurality of phosphor layers and separating the plurality of phosphor layers from each other, the partitioning layer including a substrate structure, an insulation structure, or a metal structure.

* * * * *